(12) United States Patent
Lee et al.

(10) Patent No.: US 10,964,761 B2
(45) Date of Patent: Mar. 30, 2021

(54) DISPLAY DEVICE

(71) Applicant: LG Display Co., Ltd., Seoul (KR)

(72) Inventors: Taewon Lee, Paju-si (KR); Jongchan Park, Paju-si (KR); Hyunchul Um, Paju-si (KR); Jung-Min Lee, Paju-si (KR); Jiyun Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 239 days.

(21) Appl. No.: 16/165,897

(22) Filed: Oct. 19, 2018

(65) Prior Publication Data

US 2019/0131360 A1    May 2, 2019

(30) Foreign Application Priority Data

Oct. 30, 2017 (KR) .................. 10-2017-0142305
Dec. 28, 2017 (KR) .................. 10-2017-0181780

(51) Int. Cl.
*H01L 29/08* (2006.01)
*H01L 27/32* (2006.01)
(Continued)

(52) U.S. Cl.
CPC ....... *H01L 27/3223* (2013.01); *G09G 3/3233* (2013.01); *H01L 27/3276* (2013.01);
(Continued)

(58) Field of Classification Search
CPC ............ H01L 27/3223; H01L 27/3276; G09G 3/3233; G09G 3/3225; G09G 3/3266;
(Continued)

(56) References Cited

U.S. PATENT DOCUMENTS 10,483,341 B2 * 11/2019 Jung .................. G09G 3/20
2012/0293467 A1 * 11/2012 Lee ................... G09G 3/3677
345/204

(Continued)

FOREIGN PATENT DOCUMENTS

| EP | 3211671 A1 | 8/2017 |
| EP | 3232431 A1 | 10/2017 |
| EP | 3300067 A2 | 3/2018 |

OTHER PUBLICATIONS

Extended European Search Report, European Patent Application No. 18195951.1, dated Feb. 18, 2019, 9 pages.

*Primary Examiner* — Caleb E Henry
(74) *Attorney, Agent, or Firm* — Fenwick & West LLP

(57) ABSTRACT

A display device may include an active area including a first area having a special-form portion and a second area not having a special-form portion and a bezel area including a third area close to the first area and having a special-form portion and a fourth area close to the second area and not having a special-form portion. Furthermore, the display device may include a first power supply electrode positioned in the third area of the bezel area, a semiconductor pattern positioned in the third area of the bezel area and overlapping the first power supply electrode, and a plurality of dummy gate lines positioned between the semiconductor pattern and the first power supply electrode and overlapping the semiconductor pattern to form a first compensation capacitance and overlapping the first power supply electrode to form a second compensation capacitance.

13 Claims, 9 Drawing Sheets

(51) Int. Cl.
*G09G 3/3233* (2016.01)
*G09G 3/3225* (2016.01)
*G09G 3/3266* (2016.01)
*G09G 3/3275* (2016.01)

(52) U.S. Cl.
CPC ......... *G09G 3/3225* (2013.01); *G09G 3/3266* (2013.01); *G09G 3/3275* (2013.01); *G09G 2300/0413* (2013.01); *G09G 2300/0426* (2013.01); *G09G 2310/0286* (2013.01); *G09G 2310/0289* (2013.01); *G09G 2310/08* (2013.01); *G09G 2320/0223* (2013.01); *G09G 2320/0233* (2013.01); *G09G 2320/0247* (2013.01); *G09G 2320/0276* (2013.01)

(58) Field of Classification Search
CPC ......... G09G 3/3275; G09G 2300/0413; G09G 2300/0426; G09G 2310/0286; G09G 2310/0289; G09G 2310/08; G09G 2320/0223; G09G 2320/0233; G09G 2320/0247; G09G 2320/0276
See application file for complete search history.

(56) References Cited

U.S. PATENT DOCUMENTS

| | | | |
|---|---|---|---|
| 2016/0203776 A1* | 7/2016 | Choo | G09G 3/3607 |
| | | | 345/694 |
| 2016/0335973 A1* | 11/2016 | Chung | H01L 27/124 |
| 2017/0249896 A1* | 8/2017 | Kim | H01L 27/124 |
| 2017/0301280 A1* | 10/2017 | Ka | G09G 3/3406 |
| 2017/0337876 A1* | 11/2017 | Kim | G09G 3/3266 |
| 2017/0352328 A1* | 12/2017 | Jeong | G09G 3/3266 |
| 2018/0005585 A1* | 1/2018 | Kim | H01L 27/3223 |
| 2018/0090061 A1* | 3/2018 | Kim | H01L 27/3288 |
| 2018/0151660 A1* | 5/2018 | Kim | H01L 27/3265 |
| 2018/0342572 A1* | 11/2018 | Park | H01L 27/3246 |
| 2019/0310509 A1* | 10/2019 | Shin | H01L 27/1255 |
| 2020/0194461 A1* | 6/2020 | Park | H01L 27/124 |

* cited by examiner

DISPLAY DEVICE

CROSS-REFERENCE TO RELATED APPLICATION

This disclosure claims the benefit of priority under 35 U.S.C. § 119(a) to Republic of Korea Patent Application No. 10-2017-0142305 filed on Oct. 30, 2017, and Republic of Korea Patent Application No. 10-2017-0181780 filed on Dec. 28, 2017, each of which is incorporated herein by reference in its entirety.

BACKGROUND

Field of Technology

The present disclosure relates to a display device.

Discussion of the Related Art

As information society is advanced, the needs for a display device for displaying an image are increased in various forms. For example, a display device that replaces a bulky cathode ray tube (CRT) and is thin, light and capable of a large area has been rapidly developed. As such display devices, there have been developed and utilized various display devices including a liquid crystal display (LCD), an electroluminescent display (EL) such as an organic light emitting display (OLED) and a quantum dot light emitting display (QLED), a field emission display (FED), and an electrophoretic display (ED) have been developed and utilized.

The display device includes a display panel including display elements for displaying information, a driving unit for driving the display panel, and a power supply unit for generating power to be supplied to the display panel and the driving unit.

The display device may be designed to have various designs depending on their use environments or usages. The display panel of the display device for displaying an image typically has a general form of a parallelogram, wherein the pixels (and the respective gate/data lines) are arranged parallel to the sides of the parallelogram. More specifically, the display panel usually has a rectangular form as a general form. Recently, display panels with various forms differing from a parallelogram, such as a circular form, elliptical form and other special-forms have been proposed. For example, the display panel is changed in various forms, such as a shape having a special-form portion in a typical rectangular form. The special-form portion may include, for example, partially curved surface or notch.

The display device including the display panel implemented to have a special-form portion or a circle form or an ellipse form as described above has an advantage in that it can appeal to consumers who put emphasis on the design aspect because it can increase the degree of freedom of a product design.

However, the number of pixels disposed in each line (e.g., horizontal line) may be different in the special-form portion of the display panel in which a curved surface or notch has been formed and the general-form portion of the display panel. Furthermore, the delay phenomenon of a signal between lines occurs because the deviation of a resistor-capacitor (R-C) load occurs due to a difference in the number of pixels disposed in each line having the special-form portion and the general-form portion. Accordingly, there may be problems in that a nonuniform brightness problem of the display panel occurs and display quality is degraded.

SUMMARY

This disclosure provides a display device capable of improving nonuniform brightness of a display panel by compensating the R-C load of a special-form portion in accordance with an R-C load based on a difference in the number of pixels between an area including the special-form portion of the display panel and an area not including a special-form portion.

A display device according to an embodiment of this specification may include an active area including a first area having a special-form portion and a second area not having a special-form portion and a bezel area including a third area close to the first area and having a special-form portion and a fourth area close to the second area and not having a special-form portion. Furthermore, the display device may include a first power supply electrode positioned in the third area of the bezel area, a semiconductor pattern positioned in the third area of the bezel area and overlapping the first power supply electrode, and a plurality of dummy gate lines positioned between the semiconductor pattern and the first power supply electrode and overlapping the semiconductor pattern to form a first compensation capacitance and overlapping the first power supply electrode to form a second compensation capacitance.

In accordance with the display device of this disclosure, there are effects in that an R-C load per gate line can be increased by positioning at least one compensation portion in the bezel area of the display panel having a special-form portion, and thus nonuniform brightness of the display panel can be improved by performing compensation in such a way as to be closer to an R-C load per gate line of a general-form portion.

BRIEF DESCRIPTION OF THE DRAWINGS

The accompanying drawings, which are included to provide a further understanding of the disclosure and are incorporated in and constitute a part of this disclosure, illustrate embodiments of the disclosure and together with the description serve to explain the principles of the disclosure. In the drawings.

DETAILED DESCRIPTION

Figure 1:
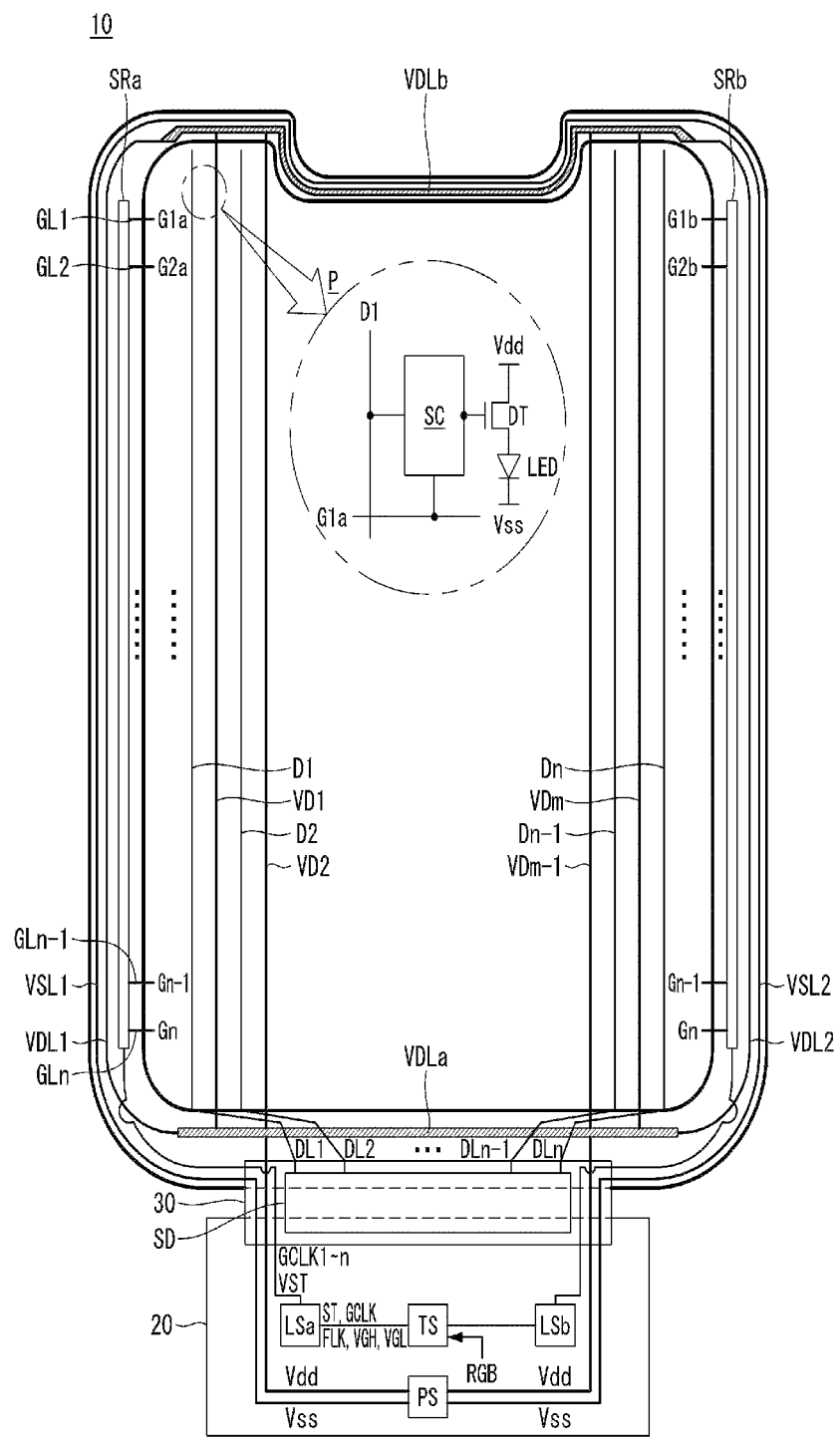
FIG. 1 is a block diagram showing a display device according to an embodiment of this disclosure.

The merits and characteristics of the disclosure and methods for achieving them will become evident from embodiments described in detail later in conjunction with the accompanying drawings. However, the disclosure is not limited to the disclosed embodiments, but may be implemented in various different ways. The embodiments are provided to only complete the disclosure of the disclosure and to allow a person having ordinary skill in the art to which the disclosure pertains to completely understand the category of the disclosure. The disclosure is only defined by the category of the claims.

A shape, size, ratio, angle, and number disclosed in the drawings for illustrating embodiments of this disclosure are illustrative, and thus the disclosure is not limited to contents shown in this disclosure. Through the disclosure, the same reference numeral denotes the same element. Furthermore, in describing this disclosure, a detailed description of a related known art will be omitted if it is deemed to make the gist of the disclosure unnecessarily vague.

If terms, such as "include (or comprise)", "have" and "consist of (or formed of)" given in this disclosure, are used, another part may be added unless "~ only" is used. If an element is expressed in the singular form, it includes a case where the element is a plural form unless specially described otherwise.

In interpreting an element, it is construed that the interpretation includes an error range unless explicitly described otherwise separately.

In the case of a description regarding a location relation, for example, if a location relation between two parts is described using "on ~", "above ~", "under (or below) ~", and "next to ~", for example, one or more parts may be positioned between the two parts unless a term, such as "right" or "directly", is used.

The first and the second may be used to describe various elements, but the elements are not restricted by the terms. The terms are used to only distinguish one element from the other element. Accordingly, a first element to be described hereunder may be a second element within the technical spirit of this disclosure.

The characteristics of multiple embodiments of this disclosure may be combined or coupled partially or entirely and technically enable various associations and driving. The embodiments may be independently implemented or may be implemented in an associative relation.

A display device according to embodiments of this disclosure is described below with reference to the accompanying drawings. Throughout the disclosure, the same reference numeral substantially denotes the same element. In the following description, a detailed description of known functions and constitutions related to this disclosure will be omitted if it is deemed to make the gist of the disclosure unnecessarily vague.

Hereinafter, a display device according to an embodiment of this disclosure is described with reference to FIGS. 1 to 3.

FIG. 1 is a block diagram showing a display device according to an embodiment of this disclosure. FIG. 2 is a plan view schematically showing a shape of the display panel shown in FIG. 1 according to an embodiment of this disclosure. FIG. 3 is a plan view showing R1 shown in FIG. 2 according to an embodiment of this disclosure.

Referring to FIG. 1, the display device according to an embodiment of this disclosure may include a display panel 10, a data driving unit, a gate driving unit of a gate in panel (GIP) type, a power supply unit PS, a timing controller TS, and so on.

The display panel 10 may include an active area AA in which information is displayed and a bezel area BA in which information is not displayed.

The active area AA is an area in which an input image is displayed and may be an area in which a plurality of pixels P is disposed in a matrix type.

The bezel area BA may be an area in which the shift registers SRa and SRb of the gate driving circuit, gate link signal lines GL1~GLn, data link signal lines DL1~DLn, first link power supply lines VDL1 and VDL2, second link power supply lines VSL1 and VSL2, and power supply electrodes VDLa and VDLb are disposed. The active area AA may include multiple data lines D1~Dn and multiple gate lines G1~Gn disposed to intersect each other and pixels P, each one being positioned in the intersection area of the data lines and the gate lines in a matrix form.

Each of the pixels P may include a light-emitting diode (LED), a thin film transistor (hereinafter referred to as a "TFT") DT controlling the amount of current flowing into the LED, and a programming unit SC for setting the gate-source voltage of the driving TFT DT. The pixels P of the display panel 10 may be supplied with a first power Vdd, that is, a high potential voltage, through first power lines VD1~VDm from the power supply unit PS, and may be supplied with a second power Vss, that is, a low potential voltage, through the second link power supply lines VSL1 and VSL2.

The first power lines VD1~VDm may be supplied with the first power Vdd from the power supply unit PS on both sides through a lower first power supply electrode VDLa positioned in the bezel area BA on the side to which a chip-on film 30 has been attached and an upper first power supply electrode VDLb positioned in the bezel area on the side opposite thereof. The lower first power supply electrode VDLa and the upper first power supply electrode VDLb may have both ends connected by the first link power supply lines VDL1 and VDL2. However, the disclosure is not limited thereto. For example, the lower first power supply electrode VDLa and the upper first power supply electrode VDLb may be connected by the first power lines VD1~VDm without forming the first link power supply lines VDL1 and VDL2 connecting both ends. Accordingly, there is an effect in that the degradation of display quality due to an increase of RC according to the location of pixels disposed in the active area AA can be minimized.

The programming unit SC may include at least one switch TFT and at least one storage capacitor. The switch TFT is turned on in response to a scan signal from the gate lines G1~Gn, so a data voltage from the data lines D1~Dn may be applied to an electrode on one side of a storage capacitor. The driving TFT DT may adjust the amount of emission of an LED by controlling the amount of current supplied to the LED based on an amount of charges charged into the storage capacitor. The amount of emission of the LED may be proportional to the amount of current supplied by the driving TFT DT.

The TFTs forming the pixel P may be implemented in a p type or an n type. Furthermore, the semiconductor layer of the TFTs forming the pixel P may include at least one of an amorphous silicon layer, polysilicon, and an oxide semiconductor material. The LED includes an anode electrode, a cathode electrode, and an emission structure interposed between the anode electrode and the cathode electrode. The anode electrode may be connected to the driving TFT DT. The emission structure includes an emission layer (EML). A hole injection layer (HIL) and a hole transport layer (HTL) may be disposed on one side of the EML. An electron transport layer (ETL) and an electron injection layer (EIL) may be disposed on the other side of the EML.

A data IC SD may be mounted on the data driving unit. Furthermore, one side of the data IC may be connected to one end of the source printed circuit board 20, and the other side of the data IC may be connected to the chip-on film 30 attached to the bezel area BA of the display panel 10.

The data IC SD may convert digital video data input from the timing controller TS into an analog gamma compensation voltage, and may generate a data voltage. The data voltage output by the data IC SD may be supplied to the data lines D1~Dn.

The gate driving unit of a GIP type may include level shifters LSa and LSb mounted on the source printed circuit board 20 and shift registers SRa and SRb formed in the bezel area BA of the display panel 10 to receive signals supplied by the level shifters LSa and LSb.

The level shifters LSa and LSb may receive signals, such as a start pulse ST, a gate shift clock GCLK, and a flicker signal FLK from the timing controller TS. Furthermore, the level shifters LSa and LSb may be supplied with driving voltages, such as a gate high voltage VGH and a gate low voltage VGL. The start pulse ST, gate shift clocks GCLK, and flicker signal FLK may swing between approximately 0 V and 3.3 V. The gate shift clocks GCLK1~GCLKn may be n-phase clock signals having a specific phase difference. The gate high voltage VGH is equal to or higher than the threshold voltage of the TFT formed in the TFT array of the display panel 10, and may be a voltage of approximately 28 V. The gate low voltage VGL is lower than the threshold voltage of the TFT formed in the TFT array of the display panel 10, and may be a voltage of approximately −5 V, but the disclosure is not limited to the specific values.

The level shifter LS may output the start pulse ST received from the timing controller TS and the shift clock signals CLK obtained by level-shifting the gate shift clocks GCLK into the gate high voltage VGH and the gate low voltage VGL, respectively. Accordingly, the start pulse VST and the shift clock signals GCLK1-GCLKn output by the level shifter LS may swing between the gate high voltage VGH and the gate low voltage VGL. The level shifter LS can lower the kick-back voltage ΔVp of a liquid crystal cell by lowering the gate high voltage in response to the flicker signal FLK, thereby being capable of reducing a flicker.

The output signals of the level shifter LS may be supplied to the shift register SR through lines formed in the chip-on film 30 in which the source drive IC SD has been positioned and line on glass (LOG) lines formed in the substrate of the display panel 10. The shift register SR may be formed directly on the bezel area BA of the display panel 10 by a GIP process.

The shift register SR may sequentially generate gate pulses that swing between the gate high voltage and the gate low voltage VGL by shifting the start pulse VST received from the level shifter LS in response to the gate shift clock signals GCLK1~GCLKn. The gate pulses output by the shift register SR are sequentially supplied to the gate lines G1~Gn.

The timing controller TS receives timing signals, such as a vertical synchronization signal, a horizontal synchronization signal, a data enable signal, and a main clock, from a host system (not shown), and synchronizes the operating timing of the data IC SD and the gate driving units (LSa, LSb, SRa, SRb). A data timing control signal for controlling the data IC SD may include a source sampling clock (SSC) and a source output enable signal (SOE). A gate timing control signal for controlling the gate driving unit (LSa and LSb, SRa, SRb) may include a gate start pulse (GSP), a gate shift clock (GSC), and a gate output enable signal (GOE).

FIG. 1 shows the structure in which the shift registers SRa and SRb are disposed on both sides outside the active area AA and the gate pulses are supplied to the gate lines G1~Gn at both ends of the active area AA, but this disclosure is not limited thereto. For example, the shift registers may be disposed only on one side of the active area AA, and the gate pulse may be supplied to the gate lines G1~Gn on one side of the active area AA. If the shift registers SRa and SRb are disposed on both sides outside the active area AA, gate pulses having the same phase and amplitude may be supplied to the pixels P disposed in the same horizontal line through the gate line.

Figure 2:
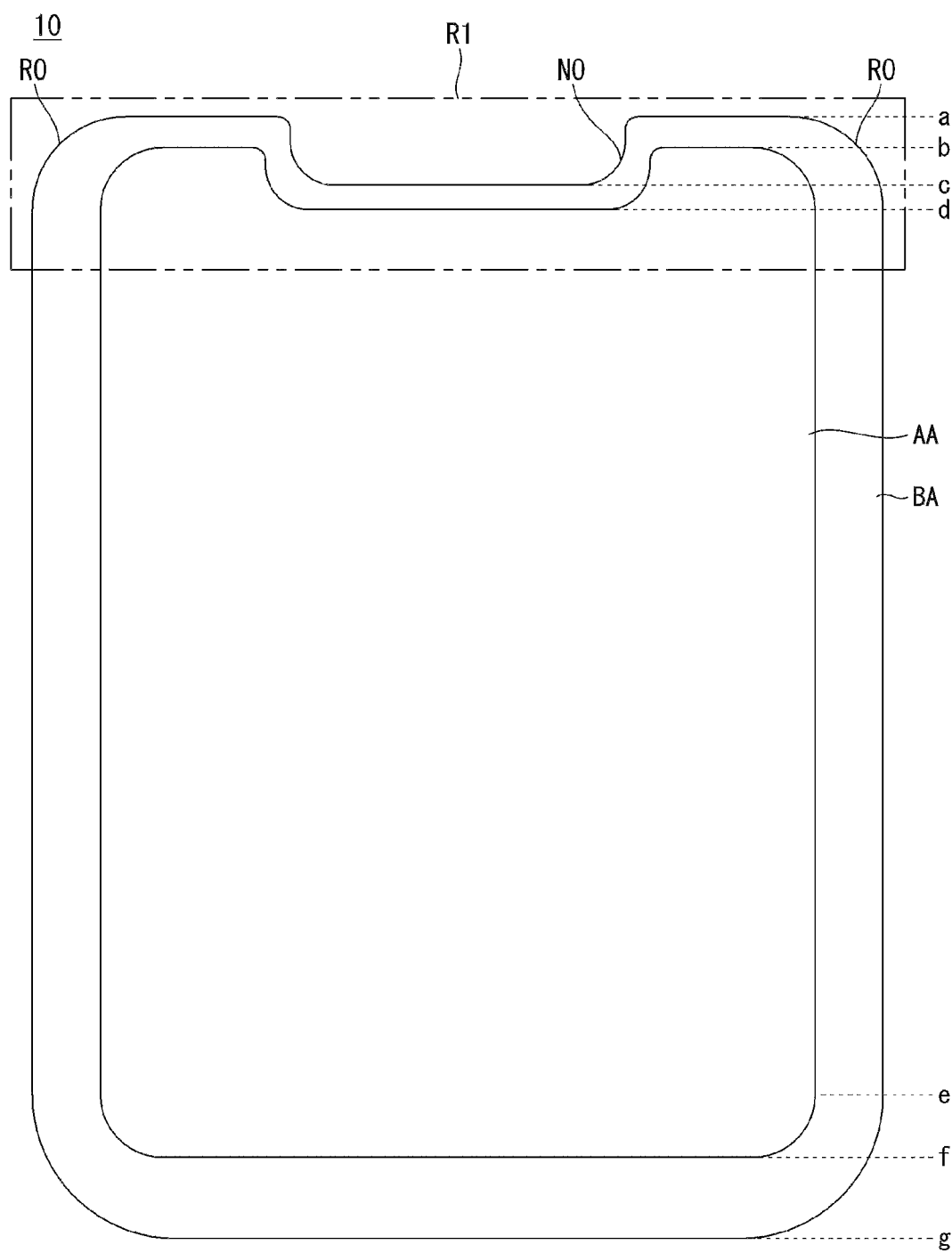
FIG. 2 is a plan view schematically showing a shape of the display panel shown in FIG. 1 according to an embodiment of this disclosure.

Referring to FIG. 2, the display panel 10 of the disclosure may include the active area AA and the bezel area BA outside the active area AA.

The active area AA is an area in which the pixels P are disposed. The active area AA may include a first area (i.e., an area from a line "b" to a line "d" and an area from a line "e" to a line "f") having a special-form portion and a second area (i.e., an area from the line "d" to the line "e") not having a special-form portion. Furthermore, the first area having the special-form portion may include a 1a-th area, that is, the area from the line "b" to the line "d", and a 1b-th area, that is, the area from the line "e" to the line "f." For example, as shown in FIG. 2, the 1a-th area may be an area that belongs to the first area having the special-form portion in the display panel 10 and that includes a rounded portion RO and a notch portion NO. The 1b-th area may be an area including only the rounded portion RO.

The bezel area BA is an area that surrounds the active area AA outside the active area AA. The bezel area BA may include a third area (i.e., an area from a line "a" to the line "d" and an area from the line "e" to a line "g") having a special-form portion similar to that of the active area AA and a fourth area (i.e., an area from the line "d" to the line "e") not having a special-form portion. Furthermore, the third area having the special-form portion may include a 3a-th area, that is, the area from the line "a" to the line "d", and a 3b-th area, that is, the area from the line "e" to the line "g." For example, as shown in FIG. 2, the 1a-th area may be an area that belongs to the third area of the bezel area BA having the special-form portion in the display panel 10 and that includes the round portion RO and the notch portion NO. The 3b-th area may be an area including only the round portion RO.

The special-form portion may include at least one of the rounded portion RO having a rounded form at an edge portion of the display panel 10 and the notch portion NO formed by removing a specific area along one side of the display panel 10.

In the example of FIG. 2, the special-form portion has been illustrated as having both the rounded portion RO and the notch portion NO, and the notch portion NO has been illustrated as being formed in the middle portion of one side of the display panel 10, but this disclosure is not limited thereto. For example, the special-form portion may include only the rounded portion or only the notch portion, and the notch portion may be formed at an edge portion. Accordingly, it should be understood that the scope of this disclosure is not limited to the example of FIG. 2.

As shown in FIG. 2, the active area AA may include the first area including the special-form portion and the second area not including the special-form portion. Furthermore, the first area (i.e., the area from the line "b" to the line "d" and the area from the line "e" to the line "f") may include the 1a-th area (i.e., the area from the line "b" to the line "d") and the 1b-th area (i.e., the area from the line "e" to the line "f"). The number of pixels P horizontally disposed for each line in the first area of the active area AA is inevitably smaller than the number of pixels P horizontally disposed for each line in the second area (i.e., the area from the line "d" to the line "e") not having a special-form portion. For example, as shown in FIG. 3, the number of pixels P corresponding to the gate lines G4a and G4b disposed in the 1a-th area of the first area may be smaller than the number of pixels P corresponding to the gate line G6 positioned in the second area. Accordingly, a nonuniform brightness problem may occur because there is a difference in the resistor-capacitor (R-C) load attributable to a difference in the number of pixels. As a result, display quality may be degraded.

Figure 3:
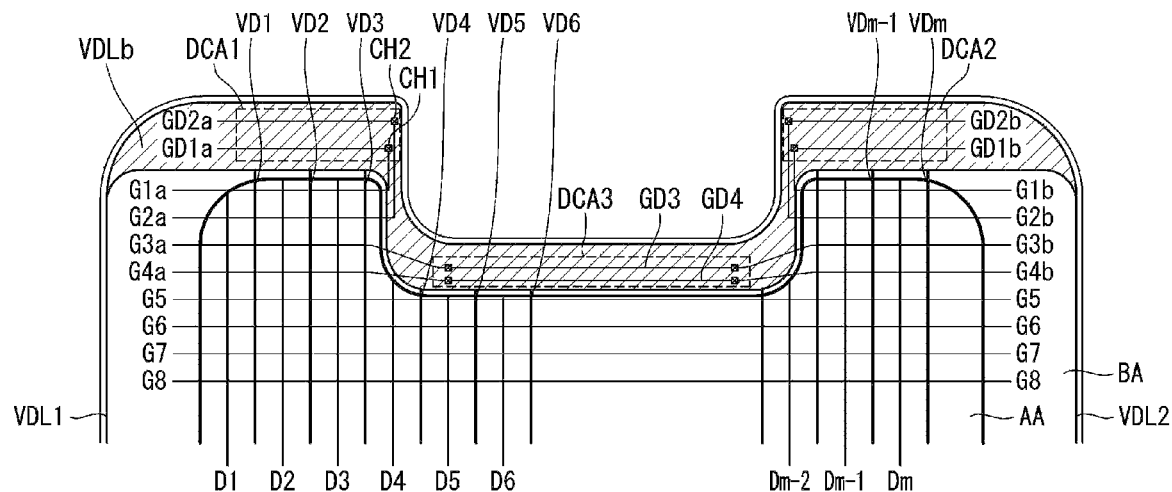
FIG. 3 is a plan view showing R1 shown in FIG. 2 according to an embodiment of this disclosure.

In this disclosure, in order to solve such a nonuniform brightness problem, as shown in FIG. 3, at least one of first to third load compensation portions DCA1, DCA2, and DCA3 is disposed in the third area of the bezel area BA in which pixels have not been formed so as to compensate for nonuniform brightness between the first area and the second area.

In FIG. 3, the active area AA of the display panel 10 has been illustrated as including first and second sub-active areas split in left and right from the 1a-th area by the notch portion NO, but this disclosure is not limited thereto. For example, a plurality of notch portions NO may be disposed at any one of the left side and right side of the active area AA or at the central part of the active area AA. Accordingly, it should be understood that the scope of protection of this disclosure is not limited to the example of FIG. 3.

Referring to FIG. 3, the display panel 10 according to an embodiment of this disclosure may include the active area AA and the bezel area BA. Furthermore, the active area AA may include the first area having a special-form portion and the second area not having a special-form portion. Furthermore, the first area may include the 1a-th area including the notch portion NO and the rounded portion RO and the 1b-th area including the rounded portion RO. The bezel area BA is positioned close to the active area AA, and may be positioned to surround the active area AA. Furthermore, the bezel area BA may include the third area having the special-form portion and the fourth area not having a special-form portion. Furthermore, the third area may include the 3a-th area including the notch portion NO and the rounded portion RO and the 3b-th area including the rounded portion RO. Furthermore, the 3a-th area of the bezel area BA may be positioned close to the 1a-th area of the active area AA, and the 3b-th area of the bezel area BA may be positioned close to the 1b-th area of the active area AA. Furthermore, the 3a-th area of the bezel area BA may have the same special-form portion as the 1a-th area of the active area AA, and the 3b-th area of the bezel area BA may have the same special-form portion as the 1b-th area of the active area AA.

In FIG. 3, the 1a-th area and second area of the active area AA and the 3a-th area and fourth area of the bezel area BA are illustrated and described. Furthermore, in FIG. 3, for the simplicity of description, a case where four gate lines horizontally extended to intersect the first power lines VD1~VDm are disposed in parallel in the 1a-th area of the first area in the active area AA of FIG. 2 is described as an example. However, the present disclosure is not limited thereto. For another example, less gate lines or more gate lines may be disposed in the 1a-th area of the first area in the active area AA.

Furthermore, a case where the pixels P have the same size in the active area AA corresponding to the 1a-th area and the second area is described as an example.

If the four gate lines are disposed in the 1a-th area of the first area, two first and second gate lines disposed on the upper area of the 1a-th area include 1a-th and 2a-th gate lines G1a and G2a sequentially supplied with first and second gate pulses from the shift register SRa on the left side and 1b-th and 2b-th gate lines G1b and G2b sequentially supplied with first and second gate pulses from the shift register SRb on the right side.

Referring to FIG. 3, the 1a-th area of the active area AA may include first and second sub-active areas split in left and right by the notch portion NO. The 1a-th and the 2a-th gate lines G1a and G2a disposed in the first sub-active area positioned on the left side of the 1a-th area may extend from the first sub-active area to the 3a-th area of the bezel area BA. For example, the 1a-th and the 2a-th gate lines G1a and G2a disposed in the first sub-active area of the 1a-th area may extend from the first sub-active area to a first compensation area positioned on the left side of the 3a-th area. The 1a-th and the 2a-th gate lines G1a and G2a may be connected to a 1a-th dummy gate line GD1a and a 2a-th dummy gate line GD2a formed in a layer different from that of the 1a-th and the 2a-th gate lines G1a and G2a in the first compensation area of the bezel area BA. The 1a-th gate line G1a and the 1a-th dummy gate line GD1a may be connected to have a "reverse ⊏" shape. Furthermore, the 2a-th gate line G2a and the 2a-th dummy gate line GD2a may be connected to have a "reverse ⊏" shape.

The 1b-th and 2b-th gate lines G1b and G2b disposed in the second sub-active area positioned on the right side of the 1a-th area may extend from the second sub-active area to the 3a-th area of the bezel area BA. For example, the 1b-th and the 2b-th gate lines G1b and G2b disposed in the second sub-active area of the 1a-th area may extend from the second sub-active area to a second compensation area positioned on the right side of the 3a-th area. The 1b-th and the 2b-th gate lines G1b and G2b may be connected to a 1b-th dummy gate line GD1b and a 2b-th dummy gate line GD2b formed in a layer different from that of the 1b-th and the 2b-th gate lines G1b and G2b in the second compensation area of the bezel area BA. The 1b-th gate line G1b and the 1b-th dummy gate line GD1b may be connected to have a "⊏" shape. Furthermore, the 2b-th gate line G2b and the 2b-th dummy gate line GD2b may be connected to have a "⊏" shape.

The display panel 10 may include the first compensation portion DCA1 in which the 1a-th and 2a-th dummy gate lines GD1a and GD2a disposed in the first compensation area positioned on the left side of the 3a-th area in the bezel area BA are formed to overlap the first power supply electrode VDLb and the second compensation portion DCA2 in which the 1b-th and the 2b-th dummy gate lines GD1b and GD2b disposed in the second compensation area positioned on the right side of the 3a-th area are formed to overlap the first power supply electrode VDLb.

Furthermore, if the four gate lines are disposed in the 1a-th area of the first area, two third and fourth gate lines disposed in the lower area of the 1a-th area may include 3a-th and 4a-th gate lines G3a and G4a sequentially supplied with third and fourth gate pulses from the shift register Sra on the left side and the 3b-th and 4b-th gate lines G3b and G4b sequentially supplied with third and fourth gate pulses from the shift register SRb on the right side.

For example, if the four gate lines are disposed in the 1a-th area of the first area, the two 3a-th and 4a-th gate lines G3a and G4a disposed in the lower area of the first sub-active area of the 1a-th area and the two 3b-th and the 4b-th gate lines G3b and G4b disposed in the lower area of the second sub-active area of the 1a-th area may be connected by the third and fourth dummy gate lines GD3 and GD4 disposed in the 3a-th area of the bezel area BA positioned in the notch portion NO.

Referring to FIG. 3, the 3a-th and 4a-th gate lines G3a and G4a of the first sub-active area and the 3b-th and 4b-th gate lines G3b and G4b of the second sub-active area may be connected by the third and fourth dummy gate lines GD3 and GD4 disposed in the third compensation area of the 3a-th area of the bezel area BA positioned between the first sub-active area and the second sub-active area.

The display panel 10 may include the third compensation portion DCA3 in which the third and fourth dummy gate lines GD3 and GD4 disposed in the third compensation area positioned in the middle of the 3a-th area are formed to overlap the first power supply electrode VDLb.

Figure 5:
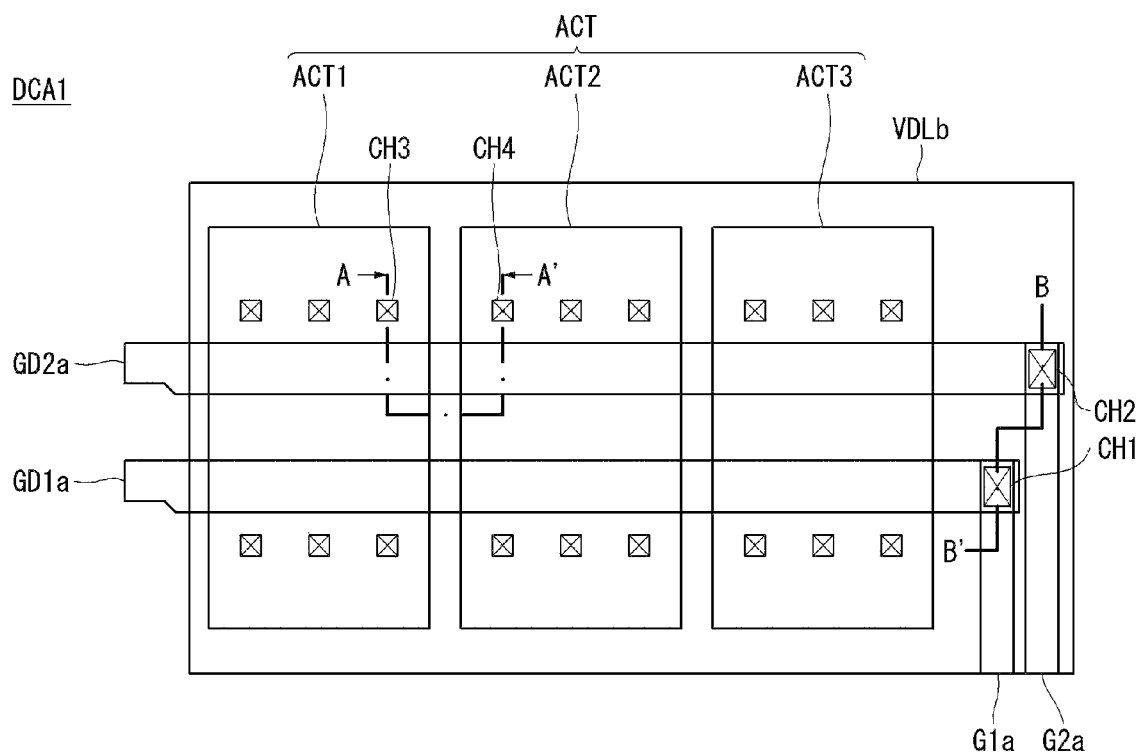
FIG. 5 is an enlarged plan view showing a portion of a first compensation portion of FIG. 3 according to an embodiment of this disclosure.
Figure 6A:
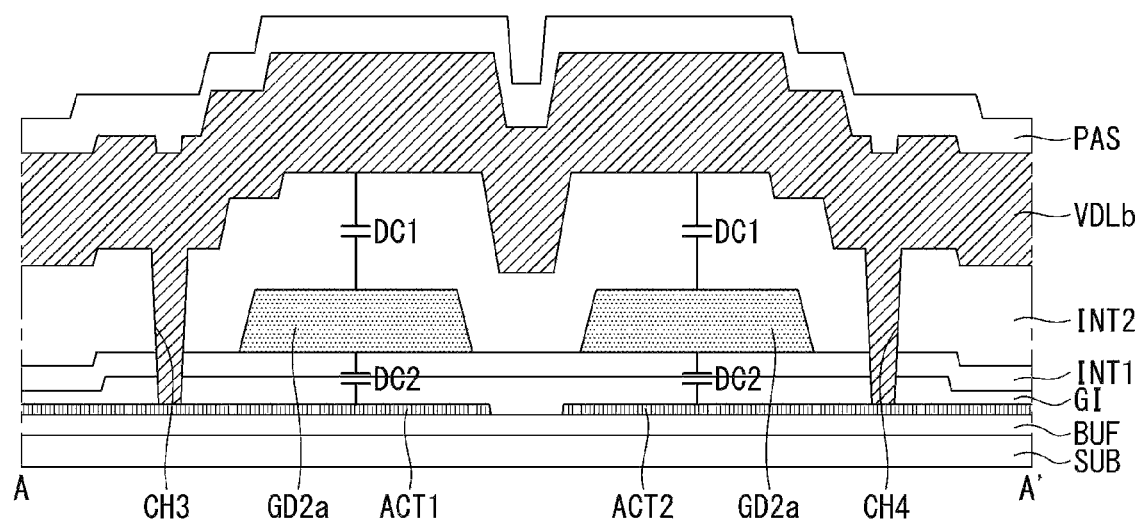
FIG. 6A is a cross-sectional view of line A-A' of FIG. 4 according to an embodiment of this disclosure.
Figure 6B:
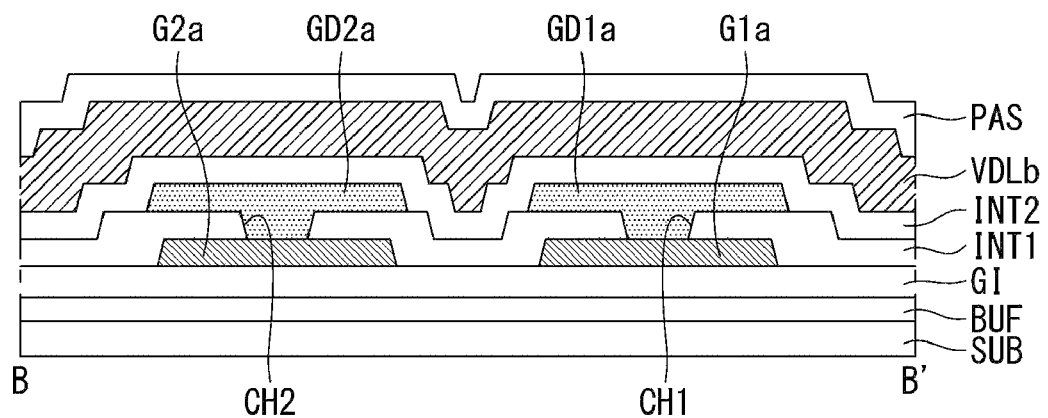
FIG. 6B is a cross-sectional view of line B-B' of FIG. 4 according to an embodiment of this disclosure.
Figure 7:
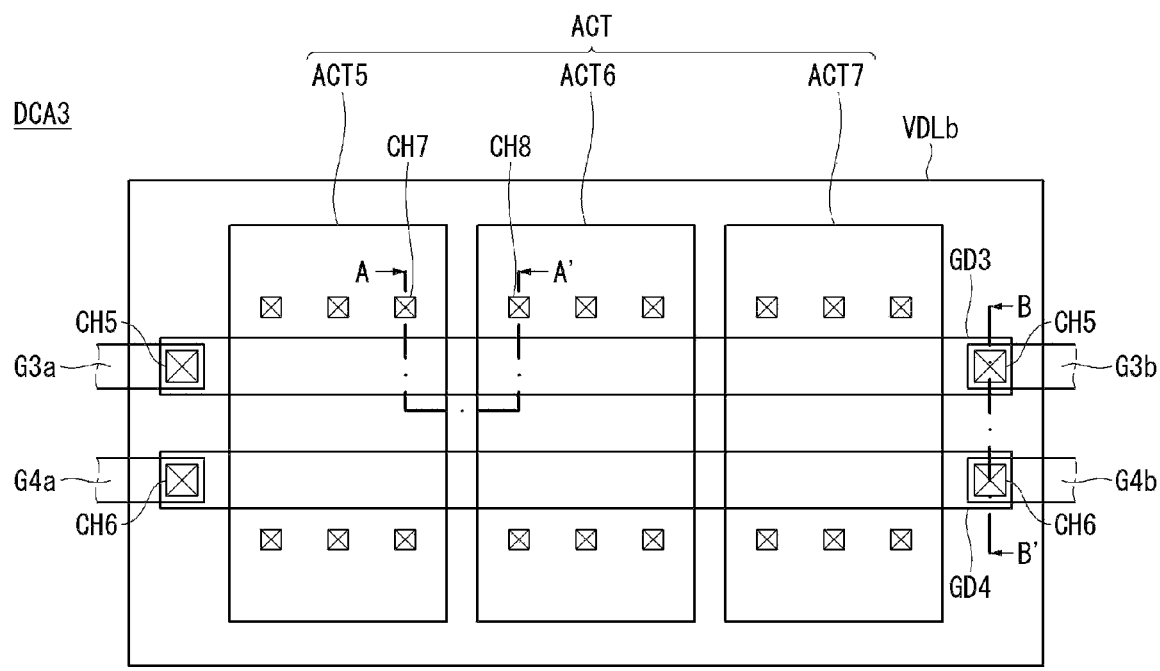
FIG. 7 is an enlarged plan view showing a portion of a third compensation portion of FIG. 3 according to an embodiment of this disclosure.
Figure 8A:
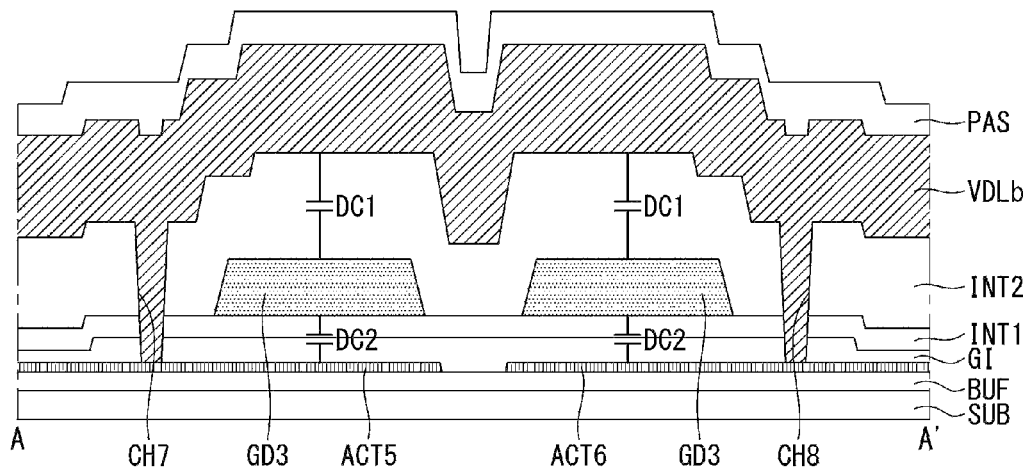
FIG. 8A is a cross-sectional view of line A-A' of FIG. 7 according to an embodiment of this disclosure.
Figure 8B:
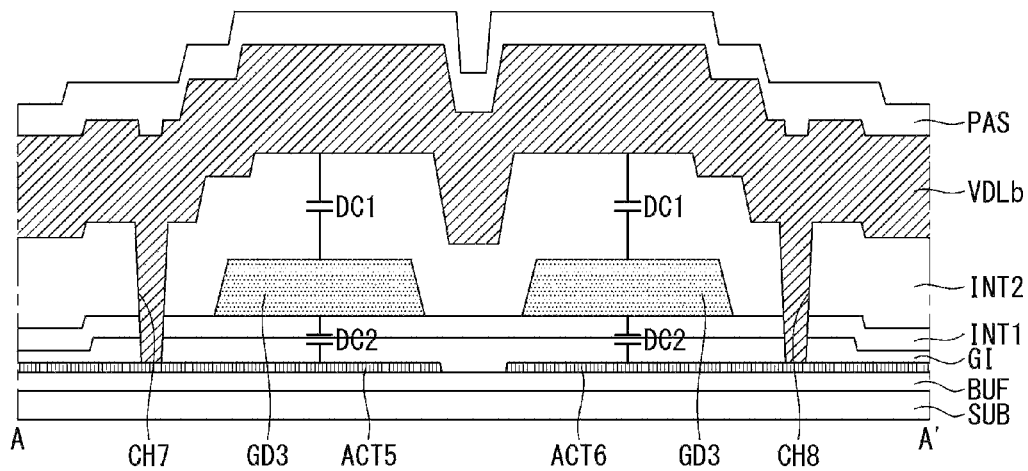
FIG. 8B is a cross-sectional view of line B-B' of FIG. 7 according to an embodiment of this disclosure.

The first compensation portion DCA1 and second compensation portion DCA2 of the display panel 10 have been described more specifically with reference to FIGS. 5, 6A, and 6B, and the third compensation portion DCA3 is described more specifically with reference to FIGS. 7, 8A, and 8B.

The first compensation portion DCA1 and the second compensation portion DCA2 are formed in different positions and have substantially same structure. Accordingly, in the following description given with reference to FIGS. 5, 6A, and 6B, the first compensation portion DCA1 is described as a representative example and thus a description of the second compensation portion DCA2 is omitted.

Prior to a description of the first to third compensation portions DCA1, DCA2, and DCA3, an exemplary sectional structure of the pixel P within the active area AA is described with reference to FIG. 4.

Figure 4:
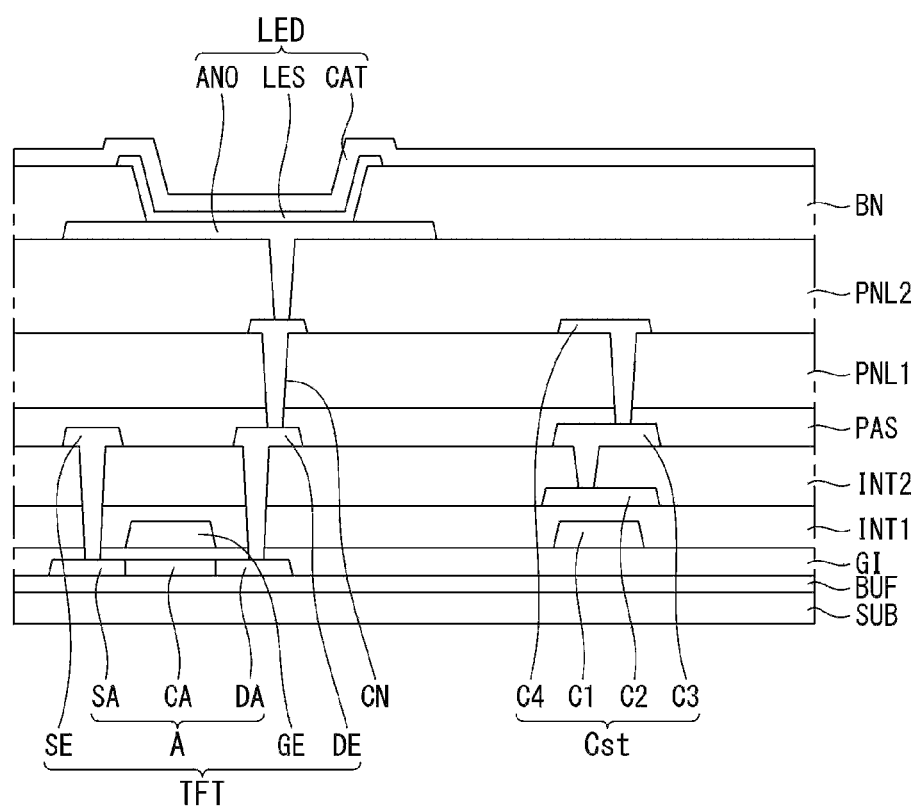
FIG. 4 is a cross-sectional view showing an internal structure of a pixel P shown in FIG. 1 according to an embodiment of this disclosure.

FIG. 4 is a cross-sectional view showing the structure of a TFT, a storage capacitor Cst, and an LED within the pixel P shown in FIG. 1 according to an embodiment of this disclosure.

Referring to FIG. 4, a buffer layer BUF of a single layer or multiple layers may be disposed on a substrate SUB. The substrate SUB may be made of a flexible semi-transparent material. If the substrate SUB is made of a material such as polyimide, the buffer layer BUF may be formed of a single layer made of any one of an inorganic material and an organic material in order to prevent an emission element from being damaged by impurities, such as alkali ions drained from the substrate SUB in a subsequent process. Furthermore, the buffer layer BUF may be formed of multiple layers made of different inorganic materials. Furthermore, the buffer layer BUF may be formed of multiple layers made of an organic layer and an inorganic layer. The inorganic layer may include any one of a silicon oxide (SiOx) film and a silicon nitride (SiNx) film, but the present disclosure is not limited thereto. The organic material may include photo acryl, but the disclosure is not limited thereto.

A semiconductor layer A may be positioned on the buffer layer BUF. The semiconductor layer A may include a source area SA and a drain area DA disposed with a channel area CA interposed therebetween. The source area SA and the drain area DA may be conductive areas. The semiconductor layer A may be formed using an amorphous silicon layer or polycrystalline silicon crystallized from an amorphous silicon layer. In some embodiments, the semiconductor layer A may be made of any one of zinc oxide (ZnO), indium zinc oxide (InZnO), indium gallium zinc oxide (InGaZnO) and zinc tin oxide (ZnSnO), but the disclosure is not limited thereto. Furthermore, the semiconductor layer A may be made of low molecular series or high molecular series, such as merocyanine, phthalocyanine, pentacene, and thiophene-polymer.

A gate insulating film GI may be positioned on the buffer layer BUF in which the semiconductor layer A is positioned in such a way as to cover or close the semiconductor layer A. The gate insulating film GI may be formed of a single layer made of an inorganic material or multiple layers made of different inorganic materials. For example, the gate insulating film GI may be formed of a silicon oxide (SiOx) film, a silicon nitride (SiNx) film or multiple layers of them.

The gate electrode GE of the TFT at least partially overlapping the channel layer CA of the semiconductor layer A and a gate line (not shown) connected to the gate electrode GE may be positioned on the gate insulating film GI. The first electrode C1 of the storage capacitor Cst may be positioned on the gate insulating film GI. The gate electrode GE and the gate line, and the first electrode C1 may be any one selected from a group consisting of molybdenum (Mo), aluminum (Al), chrome (Cr), gold (Au), titanium (Ti), nickel (Ni), and copper (Cu) or an alloy of them, and may be formed of a single layer or multiple layers.

A first interlayer dielectric layer INT1 may be positioned on the gate electrode GE and the gate insulating film GI in which the gate line and the first electrode C1 of the storage capacitor Cst are positioned in such a way as to cover or close them. The first interlayer dielectric layer INT1 may be formed of a single layer made of an inorganic material or multiple layers made of different inorganic materials. For example, the gate insulating film GI may be formed of a silicon oxide (SiOx) film or a silicon nitride (SiNx) film.

The second electrode C2 of the storage capacitor Cst may be positioned on the first interlayer dielectric layer INT1 in such a way as to overlap the first electrode C1. The second electrode C2 may be any one selected from a group consisting of molybdenum (Mo), aluminum (Al), chrome (Cr), gold (Au), titanium (Ti), nickel (Ni), and copper (Cu) or an alloy of them, and may be formed of a single layer or multiple layers.

Furthermore, a second interlayer dielectric layer INT2 may be positioned to cover the second electrode C2 of the storage capacitor Cst. The second interlayer dielectric layer INT2 may be formed of a single layer made of an inorganic material or multiple layers made of different inorganic materials. For example, the second interlayer dielectric layer INT2 may be formed of a silicon oxide (SiOx) film, a silicon nitride (SiNx) film or a dual layer of them.

The source electrode SE and drain electrode DE of the TFT may be disposed on the second interlayer dielectric layer INT2. A third electrode C3 may be positioned on the second interlayer dielectric layer INT2 in such a way as to overlap the second electrode C2 of the storage capacitor Cst. The source electrode SE and the drain electrode DE may be respectively connected to the source area SA and the drain area DA of the semiconductor layer exposed through the contact holes penetrating the gate insulating film GI and the first and second interlayer dielectric layers INT1 and INT2. The third electrode C3 of the storage capacitor Cst may be connected to the second electrode C2 exposed through the contact hole of the second interlayer dielectric layer INT2. The source electrode SE, the drain electrode DE, and the third electrode C3 of the storage capacitor Cst may be any one selected from a group consisting of molybdenum (Mo), aluminum (Al), chrome (Cr), gold (Au), titanium (Ti), nickel (Ni), and copper (Cu) or an alloy of them, and may be formed of a single layer or multiple layers.

A passivation film PAS covering the source electrode SE, the drain electrode DE, and the third electrode C3 of the storage capacitor Cst may be disposed. The passivation film PAS may be formed of a single layer made of an inorganic material or multiple layers made of different inorganic materials. For example, the passivation film PAS may be formed of a silicon oxide (SiOx) film, a silicon nitride (SiNx) film or a dual layer of them.

Furthermore, a first planarization film PNL1 may be positioned on the passivation film PAS. The first planarization film PNL1 functions to reduce the step of an underlying structure and to protect the underlying structure, and may be formed of an organic layer. For example, the first planarization film PNL1 may be formed of a photo acryl layer. A connection electrode CN for connecting the anode electrode ANO of the LED to the drain electrode DE may be positioned on the first planarization layer PNL1. Furthermore, a fourth electrode C4 that may be connected to the third electrode C3 of the storage capacitor Cst may be positioned on the first planarization film PL1. The connection electrode CN may be connected to the drain electrode DE of the TFT exposed through the contact hole of the first planarization film PNL1 and the passivation film PAS. The fourth electrode C4 of the storage capacitor Cst may be connected to the third electrode C3 of the storage capacitor Cst exposed through the contact hole of the first planarization film PNL1 and the passivation film PAS. The connection electrode CN and the fourth electrode C4 of the storage capacitor Cst may be any one selected from a group consisting of molybdenum (Mo), aluminum (Al), chrome (Cr), gold (Au), titanium (Ti), nickel (Ni), and copper (Cu) or an alloy of them, and may be formed of a single layer or multiple layers.

A second planarization film PNL2 may be positioned on the first planarization film PNL1 in such a way as to cover or close the connection electrode CN and the fourth electrode C4 of the storage capacitor Cst. The second planarization film PNL2 may be a planarization layer that functions to further reduce the step of an underlying structure attributable to the connection electrode CN on the first planarization film PNL1 and the fourth electrode C4 of the storage capacitor and to additionally protect the underlying structure. The second planarization film PNL2 may be formed of an organic layer. For example, the second planarization film PNL2 may be made of siloxane-based organic material.

An anode electrode ANO may be positioned on the second planarization film PNL2. The anode electrode ANO may be connected to a connection electrode CN exposed through a contact hole penetrating the second planarization film PNL2. The anode electrode ANO may be made of a transparent conductive material, such as indium tin oxide (ITO), indium zinc oxide (IZO) or zinc oxide (ZnO).

A bank layer BN having an opening part through which the anode electrode ANO is exposed may be formed on the second planarization film PNL2.

The opening part of the bank layer BN may be an area that defines an emission area. An emission stack LES and a cathode electrode CAT may be stacked on the anode electrode ANO exposed through the opening part of the bank layer BL. The emission stack LES may include a hole transport layer, an emission layer, and an electron transport layer. The cathode electrode CAT may be made of magnesium (Mg), calcium (Ca), aluminum (Al) or silver (Ag) having a low work function or an alloy of them. In this disclosure, the emission stack LES has been illustrated as being positioned on the anode electrode ANO and the cathode electrode CAT has been illustrated as being positioned on the emission stack LES, but in other embodiments, the emission stack LES may also be positioned on the cathode electrode CAT and the anode electrode ANO may also be positioned on the emission stack LES.

An encapsulation layer ENC may be positioned on the second planarization film PNL2 in such a way as to cover or close the cathode electrode CA and the bank layer BN. The encapsulation layer ENC (not shown) functions to prevent external moisture or oxygen from penetrating into the emission stack LES positioned within the encapsulation layer ENC, and may be formed of a multi-layer structure in which an inorganic layer and an organic layer are alternately disposed.

The first compensation portion DCA1 and second compensation portion DCA2 of the display panel 10 is described more specifically with reference to FIGS. 3, 5, 6A, and 6B. FIG. 5 is an enlarged plan view showing a portion of the first compensation portion of FIG. 3 according to an embodiment of this disclosure. FIG. 6A is a cross-sectional view of line A-A' of FIG. 4 according to an embodiment of this disclosure. Furthermore, FIG. 6B is a cross-sectional view of line B-B' of FIG. 4 according to an embodiment of this disclosure.

Referring to FIGS. 5, 6A and 6B, the first compensation portion DCA1 of the display panel 10 may include the buffer layer BUF positioned on the substrate SUB and the semiconductor pattern ACT positioned on the buffer layer BUF. The semiconductor pattern ACT of the first compensation portion DCA1 may be formed by the same process as the semiconductor layer A of the thin film transistor TFT, and may be formed on the same layer as the semiconductor layer A. Furthermore, the semiconductor pattern ACT of the first compensation portion DCA1 may be made of the same material as the semiconductor layer A of the thin film transistor TFT. The semiconductor pattern ACT of the first compensation portion DCA1 may be a layer formed by making a semiconductor substance conductive. The semiconductor pattern ACT of the first compensation portion DCA1 may be made conductive when the source area SA and drain area DA of the semiconductor layer A of the thin film transistor TFT are made conductive. The semiconductor pattern ACT of the first compensation portion DCA1 may include a plurality of semiconductor patterns (e.g., ACT1~ACT3). The gate insulating film GI may be positioned on the buffer layer BUF in such a way as to cover or close the semiconductor pattern ACT.

Referring to FIGS. 5, 6A, and 6B, the 2a-th gate line G2a and the 1a-th gate line G1a may be disposed on the gate insulating film GI in parallel.

Furthermore, the first interlayer dielectric layer INT1 may be positioned on the gate insulating film GI in such a way as to cover or close the 2a-th gate line G2a and the 1a-th gate line G1a. The 2a-th dummy gate line GD2a and the 1a-th dummy gate line GD1a may be disposed on the first interlayer dielectric layer INT1 in parallel in such a way as to at least partially overlap the 2a-th gate line G2a and the 1a-th gate line G1a. The 2a-th dummy gate line GD2a may be connected to the 2a-th gate line G2a through the second contact hole CH2 penetrating the first interlayer dielectric layer INT1, and the 1a-th dummy gate line GD1a may be connected to the 1a-th gate line G1a through the first contact hole CH1 penetrating the first interlayer dielectric layer INT1. Referring to FIGS. 6A and 6B, the 2a-th gate line G2a and the 1a-th gate line G1a may be formed by the same process as the gate electrode GE of the thin film transistor TFT, and may be formed on the same layer as the gate electrode GE. Furthermore, the 2a-th gate line G2a and the 1a-th gate line G1a may be made of the same material as the gate electrode GE of the thin film transistor TFT. Furthermore, the 1a-th dummy gate line GD1a and the 2a-th dummy gate line GD2a may be formed by the same process as the second electrode C2 of the storage capacitor Cst, and may be formed on the same layer as the second electrode C2 of the storage capacitor Cst. Furthermore, the 1a-th dummy gate line GD1a and the 2a-th dummy gate line GD2a may be made of the same material as the second electrode C2 of the storage capacitor Cst.

Referring to FIGS. 5, 6A and 6B, the 1a-th dummy gate line GD1a and the 2a-th dummy gate line GD2a may be disposed in such a way as to overlap the plurality of semiconductor patterns (e.g., ACT1, ACT2, and ACT3). The areas where the plurality of semiconductor patterns ACT1, ACT2, and ACT3 overlaps the 1a-th dummy gate line GD1a and the 2a-th dummy gate line GD2a may be formed differently in order to compensate for a capacitance value which occurs due to a difference between the number of pixels in the 1a-th area of the first area having the special-form portion in the active area AA and the number of pixels in the second area not having a special-form portion. For example, the areas where the semiconductor pattern ACT overlaps the 1a-th dummy gate line GD1a and the 2a-th dummy gate line GD2a may be formed differently based on the number or size of the semiconductor pattern ACT. Alternatively, the areas where the semiconductor pattern ACT overlaps the 1a-th dummy gate line GD1a and the 2a-th dummy gate line GD2a may be formed differently by adjusting the width or length of at least one of the 1a-th dummy gate line GD1a and the 2a-th dummy gate line GD2a. Specifically, in FIG. 5, the 1a-th dummy gate line GD1a and the 2a-th dummy gate line GD2a have been illustrated in a straight line, but may be formed to have an uneven form or a step form. As described above, if the 1a-th dummy gate line GD1a and the 2a-th dummy gate line GD2a are formed in an uneven form or a step form, the length of the 1a-th dummy gate line GD1a and the 2a-th dummy gate line GD2a is longer than that of the 1a-th dummy gate line GD1a and the 2a-th dummy gate line GD2a formed in a straight line, as shown in FIG. 5. Accordingly, the areas where the semiconductor pattern ACT overlaps the 1a-th dummy gate line GD1a and the 2a-th dummy gate line GD2a may be increased. Furthermore, a capacitance value for compensation may be increased.

The second interlayer dielectric layer INT2 may be positioned on the first interlayer dielectric layer INT1 in such a way as to cover or close the 1a-th dummy gate line GD1a and the 2a-th dummy gate line GD2a.

The first power supply electrode VDLb overlapping the 2a-th dummy gate line GD2a and the 1a-th dummy gate line GD1a may be positioned on the second interlayer dielectric layer INT2. The first power supply electrode VDLb may be connected to the semiconductor patterns ACT through third and fourth contact holes CH3 and CH4 penetrating the second interlayer dielectric layer INT2, the first interlayer dielectric layer INT1, and the gate insulating film GI. The first power supply electrode VDLb may overlap the plurality of semiconductor patterns ACT1, ACT2, and ACT3. Furthermore, the first power supply electrode VDLb may be positioned close to the 1a-th area of the active area AA. Furthermore, the first power supply electrode VDLb may be positioned in the 3a-th area of the bezel area BA.

The passivation film PAS for protecting the first power supply electrode VDLb may be positioned on the first power supply electrode VDLb.

At least one layer of the first planarization film PNL1, the second planarization film PNL2 and the encapsulation layer ENC may be formed on the passivation film PAS.

The second compensation portion DCA2 is formed similar to the first compensation portion DCA1 and may be formed using the same method as the first compensation portion DCA1, and thus the same description thereof is omitted.

The third compensation portion DCA3 of the display panel 10 is described more specifically below with reference to FIGS. 3, 7, 8A, and 8B.

FIG. 7 is an enlarged plan view showing a portion of the third compensation portion of FIG. 3 according to an embodiment of this disclosure. FIG. 8A is a cross-sectional view of line A-A' of FIG. 7 according to an embodiment of this disclosure. FIG. 8B is a cross-sectional view of line B-B' of FIG. 7 according to an embodiment of this disclosure.

Referring to FIGS. 7, 8A and 8B, the third compensation portion DCA3 of the display panel 10 may include the buffer layer BUF positioned on the substrate SUB and a plurality of semiconductor patterns (e.g., ACT5, ACT6, and ACT7) positioned on the buffer layer BUF. The semiconductor pattern ACT of the third compensation portion DCA3 may be formed by the same process as the semiconductor layer A of the thin film transistor TFT, and may be formed on the same layer as the semiconductor layer A of the thin film transistor TFT. Furthermore, the semiconductor pattern ACT of the third compensation portion DCA3 may be made of the same material as the semiconductor layer A of the thin film transistor TFT. The semiconductor pattern ACT of the third compensation portion DCA3 may be a layer formed by making a semiconductor substance conductive. The semiconductor pattern ACT of the third compensation portion DCA3 may be made conductive when the source area SA and the drain area DA of the semiconductor layer A of the thin film transistor TFT are made conductive. The gate insulating film GI may be positioned on the buffer layer BUF in such a way as to cover or close the semiconductor patterns ACT5, ACT6, and ACT7.

Referring to FIGS. 3, 7, 8A, and 8B, the 3a-th gate line G3a and the 3b-th gate line G3b may be separated and disposed on the same line on the gate insulating film GI. Furthermore, the 4a-th gate line G4a and the 4b-th gate line G4b may be separated and disposed. The 3a-th gate line G3a and the 4a-th gate line G3a may be disposed in parallel with each other. Furthermore, the 3b-th gate line G3b and the 4b-th gate line G4b may be disposed in parallel with each other.

The first interlayer dielectric layer INT1 may be positioned on the gate insulating film GI in such a way as to cover or close the 3a-th gate line G3a and the 3b-th gate line G3b and the 4a-th gate line G4a and the 4b-th gate line G4b. The third dummy gate line GD3 may be positioned on the first interlayer dielectric layer INT1 in such a way as to overlap one end of the 3a-th gate line G3a and one end of the 3b-th gate line G3b. The fourth dummy gate line GD4 may be positioned on the first interlayer dielectric layer INT1 in such a way as to overlap one end of the 4a-th gate line G4a and one end of the 4b-th gate line G4b.

The third dummy gate line GD3 may be connected to the 3a-th and the 3b-th gate lines G3a and G3b through fifth contact holes CH5 penetrating the first interlayer dielectric layer INT1. The fourth dummy gate line GD4 may be connected to the 4a-th and the 4b-th gate lines G4a and G4b through sixth contact holes CH6 penetrating the first interlayer dielectric layer INT1.

The 3a-th gate line G3a, the 3b-th gate line G3b, the 4a-th gate line G4a, and the 4b-th gate line G4b may be formed by the same process as the gate electrode GE of the thin film transistor TFT, and may be formed on the same layer as the gate electrode GE of the thin film transistor TFT. Furthermore, the 3a-th gate line G3a, the 3b-th gate line G3b, the 4a-th gate line G4a, and the 4b-th gate line G4b may be made of the same material as the gate electrode GE of the thin film transistor TFT. Furthermore, the third dummy gate line GD3 and the fourth dummy gate line GD4 may be formed by the same process as the second electrode C2 of the storage capacitor Cst, and may be formed on the same layer as the second electrode C2 of the storage capacitor Cst. Furthermore, the third dummy gate line GD3 and the fourth dummy gate line GD4 may be made of the same material as the second electrode C2 of the storage capacitor Cst.

Referring to FIGS. 7, 8A, and 8B, the second interlayer dielectric layer INT2 may be positioned on the first interlayer dielectric layer INT1 in such a way as to cover or close the third dummy gate line GD3 and the fourth dummy gate line GD4.

The first power supply electrode VDLb overlapping the third dummy gate line GD3 and the fourth dummy gate line GD4 may be positioned on the second interlayer dielectric layer INT2. The first power supply electrode VDLb may be connected to the semiconductor patterns ACT5 and ACT6 through seventh and eighth contact holes CH7 and CH8 through which the semiconductor patterns ACT5 and ACT6 are exposed through the second interlayer dielectric layer INT2, the first interlayer dielectric layer INT1, and the gate insulating film GI. Furthermore, the first power supply electrode VDLb may overlap the plurality of semiconductor patterns ACT5, ACT6, and ACT7. Furthermore, the first power supply electrode VDLb may be positioned close to the 1a-th area of the active area AA. Furthermore, the first power supply electrode VDLb may be positioned in the 3a-th area of the bezel area BA.

The passivation film PAS for protecting the first power supply electrode VDLb may be positioned on the first power supply electrode VDLb.

As shown in FIGS. 5, 6A, and 6B, the first compensation portion DCA1 having the aforementioned configuration may include the first compensation component of first compensation capacitances DC1 formed by the dummy gate line GD1a or GD2a and the first power supply electrode VDLb and the second compensation component of second compensation capacitances DC2 formed by the dummy gate line GD1a or GD2a and the plurality of semiconductor patterns ACT1, ACT2, and ACT2.

Furthermore, like the first compensation portion DCA1, the second compensation portion DCA2 may include the first compensation component of the first compensation capacitances DC1 formed by the dummy gate line GD1b or GD2b and the first power supply electrode VDLb and the second compensation component of the second compensation capacitances DC2 formed by the dummy gate line GD1b or GD2b and the plurality of semiconductor patterns.

As shown in FIGS. 7, 8A, and 8B, the third compensation portion DCA3 may include the first compensation component of the first compensation capacitances DC1 formed by the dummy gate line GD3 or GD4 and the first power supply electrode VDLb and the second compensation component of the second compensation capacitances DC2 formed by the dummy gate line GD3 or GD4 and the plurality of semiconductor patterns ACT5, ACT6, and ACT7.

Accordingly, in the display device according to an embodiment of this disclosure, the display panel 10 can maximize compensation capacitance in the limited space of the 3a-th area of the bezel area BA positioned close to the first and second sub-active areas through the first compensation portion DCA1 and the second compensation portion DCA2 having the dual compensation capacitor structure of the first capacitance C1 and the second capacitance C2. Furthermore, like the first compensation portion DCA1, the third compensation portion DCA3 can maximize compensation capacitance in the limited space of the 3a-th area positioned close to the notch portion NO of the active area AA because it has the dual compensation capacitor structure. For example, like the first compensation portion DCA1, the third compensation portion DCA can maximize compensation capacitance in the 3a-th area of the bezel area BA corresponding to the area between the first and the second sub-active areas because it has the dual compensation capacitor structure. Accordingly, an R-C load per pixel line can be increased through the first compensation portion DCA1, the second compensation portion DCA2, and the third compensation portion DCA3 disposed in the 3a-th area of the bezel area. Accordingly, there is an effect in that nonuniform brightness of a display panel can be improved by performing compensation in such a way as to be close to an R-C load per pixel line disposed in the second area, that is, the general-form portion of the active area AA.

A brightness improvement effect obtained by the display device according to an embodiment of the disclosure is described below with reference to FIG. 9.

Figure 9:
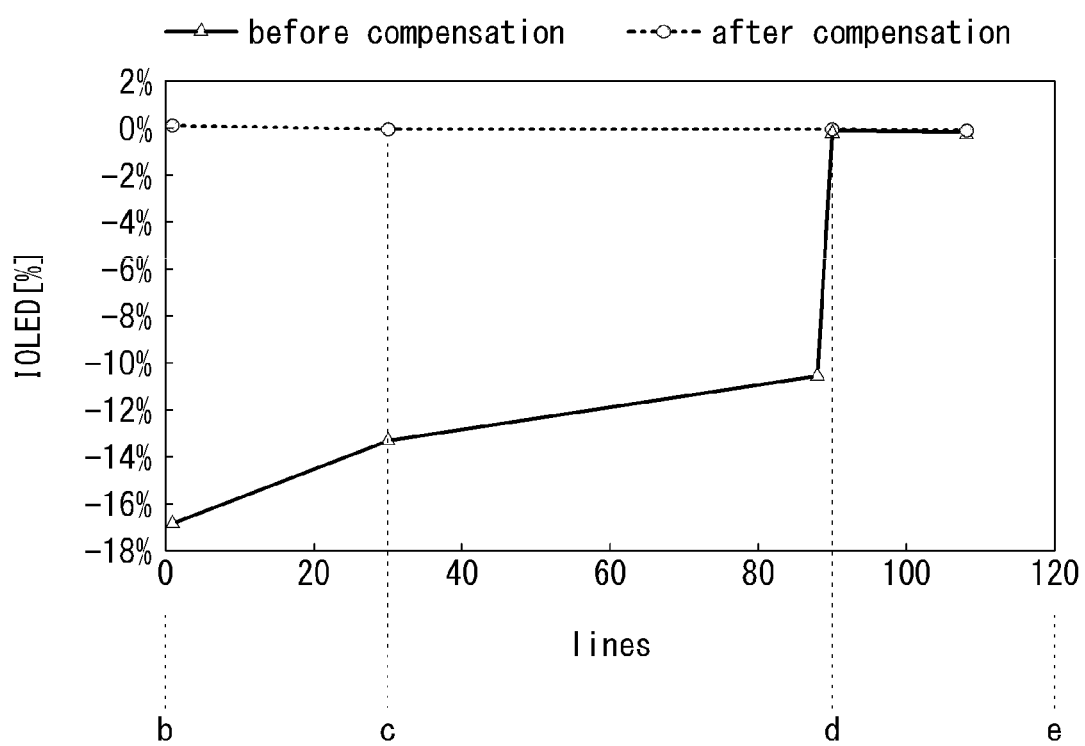
FIG. 9 is a graph showing a comparison between brightness prior to compensation and brightness of the display device after compensation according to an embodiment of the disclosure.

FIG. 9 is a graph showing a comparison between brightness prior to compensation and brightness of the display device after compensation according to an embodiment of the disclosure. In FIG. 9, a solid line shows a change in the brightness of a display device in which a compensation portion has not been formed, and a dotted line shows a change in the brightness of the display device in which the compensation portion has been formed according to an embodiment of the disclosure. In FIG. 9, reference brightness of the display device was set to 150 nit.

In FIG. 9, a traverse axis shows gate lines (i.e., (1-30)-th lines) corresponding to the section "b-c" of the 1a-th area, gate lines (i.e., (30-90)-th lines) corresponding to the section "c-d" of the 1a-th area, and gate lines (i.e., (90-120)-th lines) corresponding to a part of the section "d-e" of the second area in the display device of FIG. 2. Furthermore, a longitudinal axis shows a change in the brightness of the display device. In the longitudinal axis, 0% indicates that there is no change in the brightness of the display device compared to the reference brightness of 150 nit.

Referring to FIG. 9, in the case of the solid line showing a change in the brightness of the display device in which a compensation portion has not been formed, it can be seen that a change in brightness is not present in the section "d-e" of the second area, that is, an active area having a general-form portion, but a change in brightness occurs in the sections "b-c" and "c-d" of the 1a-th area, that is, an active area having a special-form portion. Accordingly, it may be seen that a change in brightness is about 6%~18% compared to the reference brightness.

In contrast, in the case of the dotted line showing a change in the brightness of the display device in which the compensation portion has been formed according to an embodiment of the disclosure, it can be seen that a change in brightness is not present in the sections "b-c" and "c-d" of the 1a-th area, that is, an active area having a special-form portion, in addition to the section "d-e" of the second area, that is, an active area having a general-form portion. From the graph, it can be seen that compensation can be performed close to an R-C load per gate line positioned in the second area of the active area AA having a general-form portion by increasing the R-C load of the gate line positioned in the 1a-th area of the active area AA including the special-form portion through the first compensation portion DCA1, the second compensation portion DCA2, and the third compensation portion DCA3 disposed in the 3a-th area of the bezel area BA.

As described above, an R-C load per gate line in the 1a-th area can be increased through the first compensation portion DCA1, the second compensation portion DCA2, and the third compensation portion DCA3 disposed in the 3a-th area of the bezel area BA positioned close to the 1a-th area of the active area AA. Accordingly, there is an effect in that nonuniform brightness of a display panel can be improved because compensation can be performed for the R-C load per gate line of the 1a-th area so as to be close to an R-C load per gate line of the second area in the active area AA.

Figure 10:
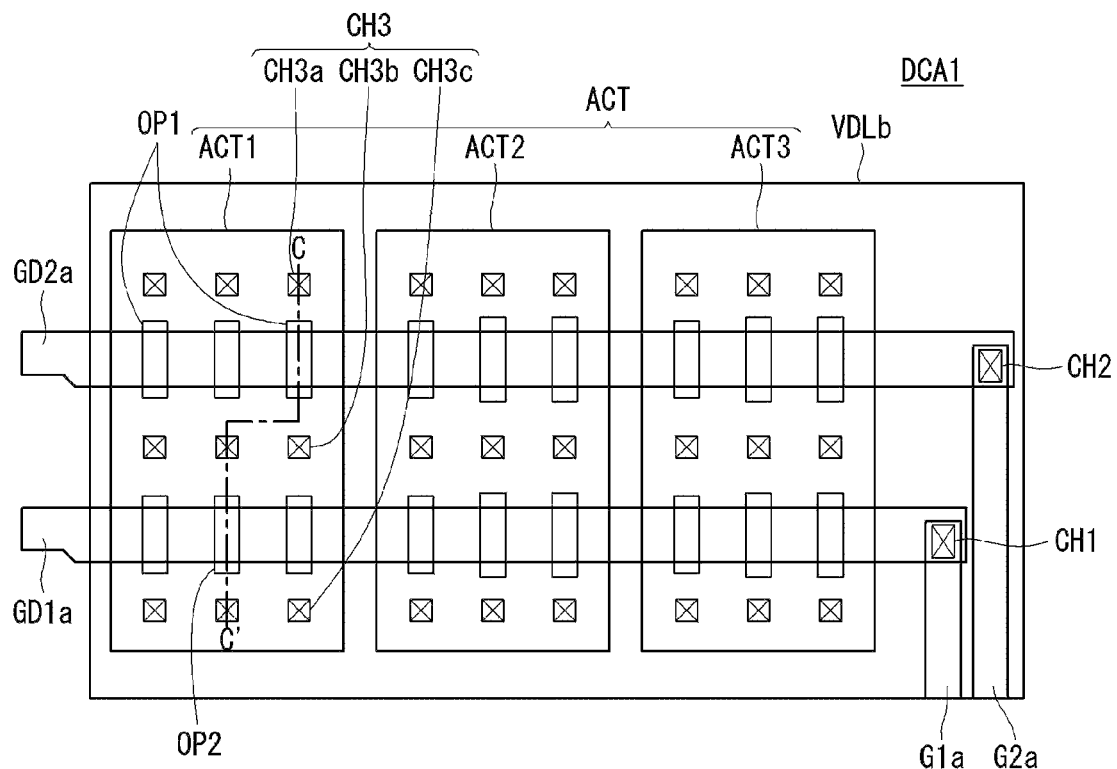
FIG. 10 is an enlarged plan view showing a portion of the first compensation portion of FIG. 3 according to an embodiment of this disclosure.
Figure 11:
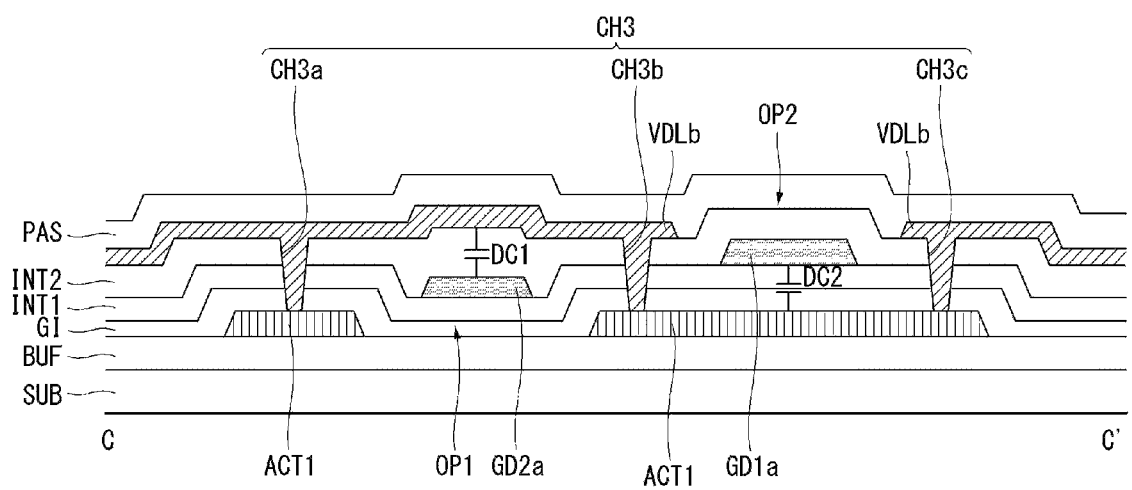
FIG. 11 is a cross-sectional view of line C-C' of FIG. 10 according to an embodiment of this disclosure.

FIG. 10 is an enlarged plan view showing a portion of the first compensation portion of FIG. 3 according to an embodiment of this disclosure. FIG. 11 is a cross-sectional view of line C-C' of FIG. 10 according to an embodiment of this disclosure. FIGS. 10 and 11 are described with reference to FIGS. 3, 5, 6A, and 6B, and a description of redundant portions is briefly given or omitted.

Referring to FIGS. 10 and 11, the first compensation portion DCA1 of the display panel 10 may include the buffer layer BUF positioned on the substrate SUB and the semiconductor pattern ACT positioned on the buffer layer BUF. The semiconductor pattern ACT of the first compensation portion DCA1 may be formed by the same process as the semiconductor layer A of the thin film transistor TFT, and may be formed on the same layer as the semiconductor layer A of the thin film transistor TFT. Furthermore, the semiconductor pattern ACT of the first compensation portion DCA1 may be made of the same material as the semiconductor layer A of the thin film transistor TFT. The semiconductor pattern ACT of the first compensation portion DCA1 may be a layer formed by making a semiconductor substance conductive. The semiconductor pattern ACT of the first compensation portion DCA1 may be formed when the source area SA and drain area DA of the semiconductor layer A of the thin film transistor TFT are made conductive. The semiconductor pattern ACT of the first compensation portion DCA1 may include a plurality of semiconductor patterns (e.g., ACT1~ACT3).

Referring to FIG. 10, the 1a-th dummy gate line GD1a and the 2a-th dummy gate line GD2a may be disposed to overlap the plurality of semiconductor patterns (e.g., ACT1, ACT2, and ACT3). the areas where the plurality of semiconductor patterns ACT1, ACT2, and ACT3 overlaps the 1a-th dummy gate line GD1a and the 2a-th dummy gate line GD2a may be formed differently in order to compensate for a capacitance value occurring due to a difference between the number of pixels in the 1a-th area of the first area having a special-form portion and the number of pixels in the second area not having a special-form portion in the active area AA.

For example, the areas where the semiconductor pattern ACT overlaps the 1a-th dummy gate line GD1a and the 2a-th dummy gate line GD2a may be formed differently based on the number or size of the semiconductor pattern ACT. Furthermore, the areas where the semiconductor pattern ACT overlaps the 1a-th dummy gate line GD1a and the 2a-th dummy gate line GD2a may be formed differently by adjusting the width or length of at least one of the 1a-th dummy gate line GD1a and the 2a-th dummy gate line GD2a.

Furthermore, the areas where the semiconductor pattern ACT overlaps the 1a-th dummy gate line GD1a and the 2a-th dummy gate line GD2a may be formed differently by forming a first opening part OP1 in the semiconductor pattern ACT. For example, as shown in FIGS. 10 and 11, the first opening part OP1 may be formed by removing a portion of the semiconductor pattern ACT that overlap the 1a-th dummy gate line GD1a and the 2a-th dummy gate line GD2a. The width of the first opening part OP1 may be formed greater than the width of the 1a-th dummy gate line GD1a and the 2a-th dummy gate line GD2a.

The width of the first opening part OP1 may be formed smaller than the width of the 1a-th dummy gate line GD1a and the 2a-th dummy gate line GD2a based on a capacitance value for compensation.

Referring to FIG. 10, the first opening part OP1 is located in the semiconductor pattern ACT, and a plurality of first opening parts OP1 may be formed.

The gate insulating film GI and the first interlayer dielectric layer INT1 may be disposed on the buffer layer BUF in such a way as to cover or close the semiconductor pattern ACT and the first opening part OP1. Furthermore, the 1a-th dummy gate line GD1a and the 2a-th dummy gate line GD2a may be disposed on the first interlayer dielectric layer INT in such a way as to overlap the semiconductor pattern ACT and the first opening part OP1.

Furthermore, the 1a-th dummy gate line GD1a and the 2a-th dummy gate line GD2a may be formed by the same process as the second electrode C2 of the storage capacitor Cst, and may be formed on the same layer as the second electrode C2 of the storage capacitor Cst. Furthermore, the 1a-th dummy gate line GD1a and the 2a-th dummy gate line GD2a may be made of the same material as the second electrode C2 of the storage capacitor Cst.

Referring to FIG. 11, the second interlayer dielectric layer INT2 may be positioned on the first interlayer dielectric layer INT1 in such a way as to cover or close the 1a-th dummy gate line GD1a and the 2a-th dummy gate line GD2a.

The first power supply electrode VDLb overlapping the 2a-th dummy gate line GD2a and the 1a-th dummy gate line GD1a may be positioned on the second interlayer dielectric layer INT2. The first power supply electrode VDLb may be connected to the semiconductor pattern ACT through the third contact hole CH3 penetrating the second interlayer dielectric layer INT2, the first interlayer dielectric layer INT1, and the gate insulating film GI. Furthermore, the first power supply electrode VDLb may overlap the plurality of semiconductor patterns ACT1, ACT2, and ACT3. Furthermore, a second opening part OP2 may be formed by removing a portion of the first power supply electrode VDLb overlapping the 1a-th dummy gate line GD1a and the 2a-th dummy gate line GD2a. The width of the second opening part OP2 may be formed greater than the width of the 1a-th dummy gate line GD1a and the 2a-th dummy gate line GD2a. The width of the second opening part OP2 may be formed smaller than the 1a-th dummy gate line GD1a and the 2a-th dummy gate line GD2a based on a capacitance value for compensation. Furthermore, the second opening part OP2 may be positioned to overlap the semiconductor pattern ACT.

Referring to FIG. 11, the third contact hole CH3 through which the semiconductor pattern ACT is exposed through the second interlayer dielectric layer INT2, the first interlayer dielectric layer INT1, and the gate insulating film GI may be positioned on both sides of the 1a-th dummy gate line GD1a and the 2a-th dummy gate line GD2a, and may be positioned to not overlap the first opening part OP1 of the semiconductor pattern ACT. For example, the 3a-th contact hole CH3a and the 3b-th contact hole CH3b may be disposed on both sides of the 2a-th dummy gate line GD2a, and the 3b-th contact hole CH3b and the 3c-th contact hole CH3c may be disposed on both sides of the 1a-th dummy gate line GD1a. Furthermore, the 3a-th contact hole CH3a, the 3b-th contact hole CH3b, and the 3c-th contact hole CH3c may be positioned to not overlap the first opening part OP1 of the semiconductor pattern ACT.

Furthermore, the second opening part OP2 of the first power supply electrode VDLb may be positioned to overlap the 1a-th dummy gate line GD1a and the 2a-th dummy gate line GD2a. Furthermore, the second opening part OP2 of the first power supply electrode VDLb may be positioned to not overlap the first opening part OP1 of the semiconductor pattern ACT. Furthermore, the second opening part OP2 of the first power supply electrode VDLb may be positioned to not overlap the third contact hole CH3.

The first power supply electrode VDLb may overlap the first opening part OP1 of the semiconductor pattern ACT.

Furthermore, as shown in FIG. 3, the first power supply electrode VDLb may be positioned close to the 1a-th area of the active area AA. Furthermore, the first power supply electrode VDLb may be positioned in the 3a-th area of the bezel area BA.

The first power supply electrode VDLb may be formed by the same process as the source electrode SE and drain electrode DE of the thin film transistor TFT, and may be formed on the same layer as the source electrode SE and drain electrode DE of the thin film transistor TFT. Furthermore, the first power supply electrode VDLb may be made of the same material as the source electrode SE and drain electrode DE of the thin film transistor TFT.

The first opening part OP1 of the semiconductor pattern ACT overlaps the 1a-th dummy gate line GD1a and the 2a-th dummy gate line GD2a and also overlaps the first power supply electrode VDLb. Accordingly, a single compensation capacitor structure including the first compensation component of the first compensation capacitance DC1 only may be present in the area in which the first opening part OP1 has been positioned. The first compensation capacitance DC1 may have a structure in which the 1a-th dummy gate line GD1a and the 2a-th dummy gate line GD2a overlap the first power supply electrode VDLb with the second interlayer dielectric layer INT2 interposed therebetween.

Furthermore, the second opening part OP2 of the first power supply electrode VDLb overlaps the semiconductor pattern ACT and also overlaps the 1a-th dummy gate line GD1a and the 2a-th dummy gate line GD2a. Accordingly, a single compensation capacitor structure including the second compensation component of the second compensation capacitance DC2 only may be present in the area in which the second opening part OP2 has been positioned. The second compensation capacitance DC2 may have a structure in which the 1a-th dummy gate line GD1a and the 2a-th dummy gate line GD2a overlap the semiconductor pattern ACT with the gate insulating film GI and the first interlayer dielectric layer INT1 interposed therebetween.

The passivation film PAS for protecting the first power supply electrode VDLb may be positioned on the first power supply electrode VDLb.

At least one of the first planarization film PNL1, the second planarization film PNL2, and the encapsulation layer ENC may be formed on the passivation film PAS.

The second compensation portion DCA2 is formed similar to the first compensation portion DCA1 and formed using the same method as the first compensation portion DCA1, and thus a description thereof is omitted.

Figure 12:
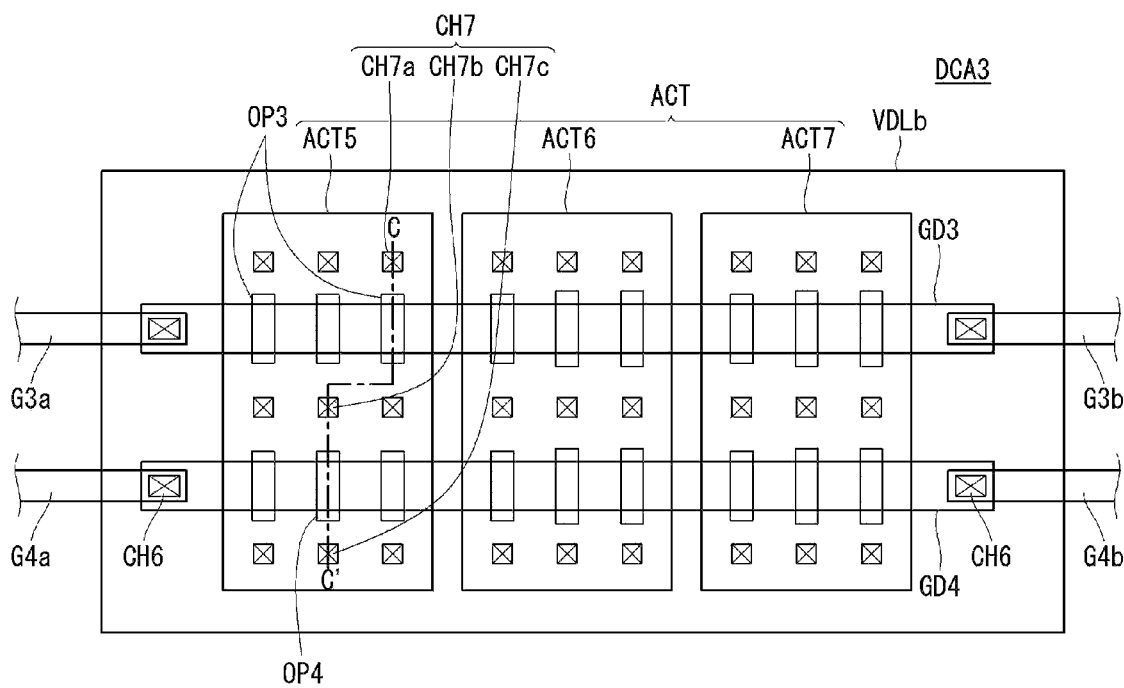
FIG. 12 is an enlarged plan view showing a portion area of the third compensation portion of FIG. 3 according to an embodiment of this disclosure.
Figure 13:
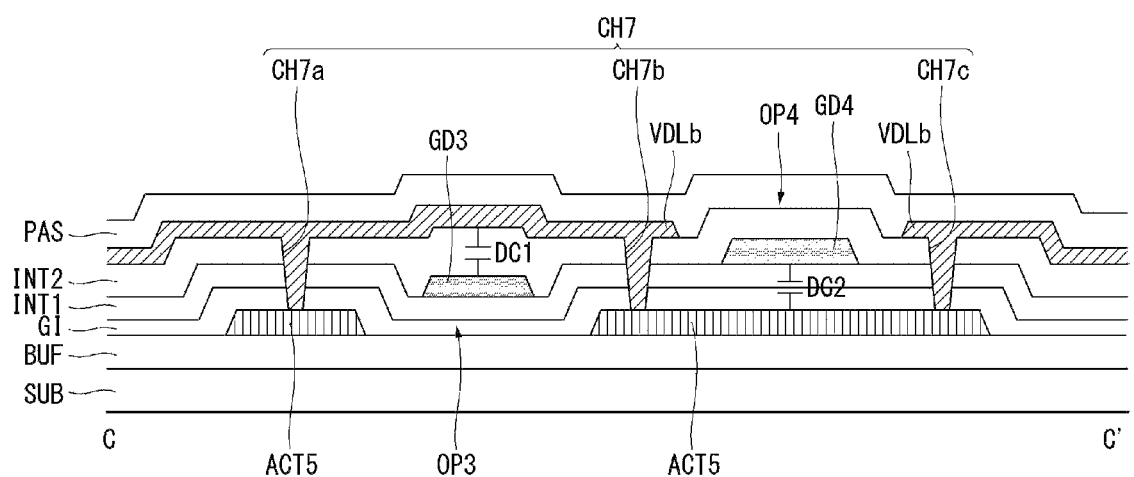
FIG. 13 is a cross-sectional view of line C-C' of FIG. 12 according to an embodiment of this disclosure.

FIG. 12 is an enlarged plan view showing a portion of the third compensation portion of FIG. 3. FIG. 13 is a cross-sectional view of line C-C' of FIG. 12. FIGS. 12 and 13 are described with reference to FIGS. 3, 7, 8A, and 8B, and a description of redundant portions are briefly given or omitted.

Referring to FIG. 12, the third compensation portion DCA3 of the display panel 10 may include the buffer layer BUF positioned on the substrate SUB and a plurality of semiconductor patterns (e.g., ACT5, ACT6, and ACT7) positioned on the buffer layer BUF. The semiconductor pattern ACT of the third compensation portion DCA3 may be formed by the same process as the semiconductor layer A of the thin film transistor TFT, and may be formed on the same layer as the semiconductor layer A of the thin film transistor TFT. Furthermore, the semiconductor pattern ACT of the third compensation portion DCA3 may be made of the same material as the semiconductor layer A of the thin film transistor TFT. The semiconductor pattern ACT of the third compensation portion DCA3 may be a layer formed by making a semiconductor substance conductive. The semiconductor pattern ACT of the third compensation portion DCA3 may be formed when the source area SA and drain area DA of the semiconductor layer A of the thin film transistor TFT are made conductive. The gate insulating film GI may be positioned on the buffer layer BUF in such a way as to cover the semiconductor patterns ACT5, ACT6, and ACT7.

Referring to FIG. 12, the third dummy gate line GD3 and the fourth dummy gate line GD4 may be disposed to overlap the plurality of semiconductor patterns (e.g., ACT5, ACT6, and ACT7). The areas where the plurality of semiconductor patterns ACT5, ACT6, and ACT7 overlaps the third dummy gate line GD3 and the fourth dummy gate line GD4 may be formed differently in order to compensate for a capacitance value occurring due to a difference between the number of pixels in the 1a-th area of the first area having a special-form portion and the number of pixels in the second area not having a special-form portion in the active area AA.

For example, the areas where the semiconductor pattern ACT overlaps the third dummy gate line GD3 and the fourth dummy gate line GD4 may be formed differently based on the number or size of the semiconductor pattern ACT. Furthermore, the areas where the semiconductor pattern ACT overlaps the third dummy gate line GD3 and the fourth dummy gate line GD4 may be formed differently by adjusting the width or length of at least one of the third dummy gate line GD3 and the fourth dummy gate line GD4.

Furthermore, the areas where the semiconductor pattern ACT overlaps the third dummy gate line GD3 and the fourth dummy gate line GD4 may be formed differently by forming the third opening part OP3 in the semiconductor pattern ACT. For example, as shown in FIGS. 12 and 13, the third opening part OP3 may be formed by removing a portion of the semiconductor pattern ACT overlapping the third dummy gate line GD3 and the fourth dummy gate line GD4. The width of the third opening part OP3 may be formed greater than the width of the third dummy gate line GD3 and the fourth dummy gate line GD4.

The width of the third opening part OP3 may be formed smaller than the width of the third dummy gate line GD3 and the fourth dummy gate line GD4 based on a capacitance value for compensation.

Referring to FIG. 12, the third opening part OP3 is located within the semiconductor pattern ACT, and a plurality of third opening parts OP3 may be formed.

Referring to FIG. 13, the gate insulating film GI and the first interlayer dielectric layer INT1 may be disposed on the buffer layer BUF in such a way as to cover the semiconductor pattern ACT and the third opening part OP3. Furthermore, the third dummy gate line GD3 and the fourth dummy gate line GD4 may be disposed on the first interlayer dielectric layer INT in such a way as to overlap the semiconductor pattern ACT and the third opening part OP3.

Furthermore, the third dummy gate line GD3 and the fourth dummy gate line GD4 may be formed by the same process as the second electrode C2 of the storage capacitor Cst, and may be formed on the same layer as the second electrode C2 of the storage capacitor Cst. Furthermore, the third dummy gate line GD3 and the fourth dummy gate line GD4 may be made of the same material as the second electrode C2 of the storage capacitor Cst.

Furthermore, the second interlayer dielectric layer INT2 may be positioned on the first interlayer dielectric layer INT1 in such a way as to cover or close the third dummy gate line GD3 and the fourth dummy gate line GD4.

The first power supply electrode VDLb overlapping the third dummy gate line GD3 and the fourth dummy gate line GD4 may be positioned on the second interlayer dielectric layer INT2. The first power supply electrode VDLb may be connected to the semiconductor pattern ACT through the seventh contact hole CH7 penetrating the second interlayer dielectric layer INT2, the first interlayer dielectric layer INT1, and the gate insulating film GI. Furthermore, the first power supply electrode VDLb may overlap the plurality of semiconductor patterns ACT5, ACT6, and ACT7. Furthermore, the first power supply electrode VDLb may be positioned close to the 1a-th area of the active area AA. Furthermore, the first power supply electrode VDLb may be positioned in the 3a-th area of the bezel area BA.

A fourth opening part OP4 may be formed by removing a portion of the first power supply electrode VDLb overlapping the third dummy gate line GD3 and the fourth dummy gate line GD4. The width of the fourth opening part OP4 may be formed greater than the width of the third dummy gate line GD3 and the fourth dummy gate line GD4.

The width of the third dummy gate line GD3 and the fourth dummy gate line GD4 may be formed smaller than the width of the fourth opening part OP4 based on a capacitance value for compensation. Furthermore, the fourth opening part OP4 may be positioned to overlap the semiconductor pattern ACT.

Referring to FIG. 13, the seventh contact hole CH7 through which the semiconductor pattern ACT is exposed through the second interlayer dielectric layer INT2, the first interlayer dielectric layer INT1, and the gate insulating film GI may be positioned on both sides of the third dummy gate line GD3 and the fourth dummy gate line GD4. The seventh contact hole CH7 may be positioned to not overlap the third opening part OP3 of the semiconductor pattern ACT. For example, a 7a-th contact hole CH7a and a 7b-th contact hole CH7b may be disposed on both sides of the third dummy gate line GD3. The 7b-th contact hole CH7b and the 7c-th contact hole CH7c may be disposed on both sides of the fourth dummy gate line GD4. Furthermore, the 7a-th contact hole CH7a, the 7b-th contact hole CH7b, and the 7c-th contact hole CH7c may be disposed to not overlap the third opening part OP3 of the semiconductor pattern ACT.

Furthermore, the fourth opening part OP4 of the first power supply electrode VDLb may be positioned to overlap the third dummy gate line GD3 and the fourth dummy gate line GD4. Furthermore, the fourth opening part OP4 of the first power supply electrode VDLb may be positioned to not overlap the third opening part OP3 of the semiconductor pattern ACT. Furthermore, the fourth opening part OP4 of the first power supply electrode VDLb may be positioned to not overlap the seventh contact hole CH7.

The first power supply electrode VDLb may overlap the third opening part OP3 of the semiconductor pattern ACT.

The third opening part OP3 of the semiconductor pattern ACT overlaps the third dummy gate line GD3 and the fourth dummy gate line GD4 and also overlaps the first power supply electrode VDLb. Accordingly, a single compensation capacitor structure including the first compensation component of the first compensation capacitance DC1 only may be present in the area where the third opening part OP3 has been positioned. The first compensation capacitance DC1 may have a structure in which the third dummy gate line GD3 and the fourth dummy gate line GD4 overlap the first power supply electrode VDLb with the second interlayer dielectric layer INT2 interposed therebetween.

Furthermore, the fourth opening part OP4 of the first power supply electrode VDLb overlaps the semiconductor pattern ACT and also overlaps the third dummy gate line GD3 and the fourth dummy gate line GD4. Accordingly, a single compensation capacitor structure including the second compensation component of the second compensation capacitance DC2 only may be present in the area where the second opening part OP2 has been positioned. The second compensation capacitance DC2 may have a structure in which the third dummy gate line GD3 and the fourth dummy gate line GD4 overlap the semiconductor pattern ACT with the gate insulating film GI and the first interlayer dielectric layer INT1 interposed therebetween.

The passivation film PAS for protecting the first power supply electrode VDLb may be positioned on the first power supply electrode VDLb. Furthermore, at least one of the first planarization film PNL1, the second planarization film PNL2, and the encapsulation layer ENC may be formed on the passivation film PAS.

The display device according to this disclosure may be described as follow.

A display device according to an embodiment of this disclosure may include an active area including a first area having a special-form portion and a second area not having a special-form portion and a bezel area including a third area close to the first area and having a special-form portion and a fourth area close to the second area and not having a special-form portion. Furthermore, the display device may include a first power supply electrode positioned in the third area of the bezel area, a semiconductor pattern positioned in the third area of the bezel area and overlapping the first power supply electrode, and a plurality of dummy gate lines positioned between the semiconductor pattern and the first power supply electrode and overlapping the semiconductor pattern to form a first compensation capacitance and overlapping the first power supply electrode to form a second compensation capacitance.

In accordance with an embodiment of this disclosure, the semiconductor pattern may be connected to the first power supply electrode, and the plurality of dummy gate lines may be connected to a plurality of gate lines of the active area, respectively.

In accordance with an embodiment of this disclosure, the semiconductor pattern may include a conductive semiconductor pattern.

In accordance with an embodiment of this disclosure, the first area of the active area may include a 1a-th area having a rounded portion in an edge and a notch portion formed by removing one side of the active area and a 1b-th area having only a rounded portion. The third area of the bezel area may include a 3a-th area close to the 1a-th area and a 3b-th area close to the 1b-th area.

In accordance with an embodiment of this disclosure, the 1a-th area having the notch portion may include first and second sub-active areas split in left and right by the notch portion.

In accordance with an embodiment of this disclosure, the plurality of gate lines may include first and second gate lines disposed close to the 3a-th area of the bezel area in the first sub-active area and the second sub-active area and third and fourth gate lines disposed close to the second area of the active area in the first sub-active area and the second sub-active area.

In accordance with an embodiment of this disclosure, the first, second, third, and fourth gate lines may include 1a-th, 2a-th, 3a-th, and 4a-th gate lines disposed in the first sub-active area and 1b-th, 2b-th, 3b-th, and 4b-th gate lines disposed in the second sub-active area.

In accordance with an embodiment of this disclosure, the plurality of dummy gate lines may include 1a-th and 2a-th dummy gate lines disposed in the 3a-th area of the bezel area close to the first sub-active area and 1b-th and 2b-th dummy gate lines disposed in the 3a-th area of the bezel area close to the second sub-active area. The 1a-th and 2a-th dummy gate lines are connected to the 1a-th and 1b-th gate lines of the first sub-active area, respectively, and the 1b-th and 2b-th dummy gate lines are connected to the 1b-th and 2b-th gate lines of the second sub-active area, respectively.

In accordance with an embodiment of this disclosure, the plurality of dummy gate lines may further include third and fourth dummy gate lines disposed in the 3a-th area of the bezel area and positioned between the first sub-active area and the second sub-active area. The 3a-th gate line positioned in the first sub-active area and the 3b-th gate line positioned in the second sub-active area may be connected by the third dummy gate line. The 4a-th gate line positioned in the first sub-active area and the 4b-th gate line positioned in the second sub-active area may be connected by the fourth dummy gate line.

In accordance with an embodiment of this disclosure, the display device may further include a first opening part formed by removing a portion of the semiconductor pattern overlapping the plurality of dummy gate lines.

In accordance with an embodiment of this disclosure, the display device may further include a second opening part formed by removing a portion of the first power supply electrode overlapping the plurality of dummy gate lines. The second opening part may not overlap the first opening part.

In accordance with an embodiment of this disclosure, the semiconductor pattern may be positioned over a substrate, the plurality of gate lines may be positioned over a gate insulating film covering the semiconductor pattern, and the plurality of dummy gate lines may be positioned over a first interlayer dielectric layer covering the plurality of gate lines. The first power supply electrode may be positioned over a second interlayer dielectric layer covering the plurality of dummy gate lines.

In accordance with an embodiment of this disclosure, the plurality of dummy gate lines may be connected to the plurality of gate lines, respectively, through a contact hole formed in the first interlayer dielectric layer. The first power supply electrode may be connected to the semiconductor pattern through a contact hole penetrating the second interlayer dielectric layer, the first interlayer dielectric layer, and the gate insulating film.

A display device according to an embodiment of this disclosure may include an active area including a first area having a special-form portion and a second area not having a special-form portion and a bezel area including a third area corresponding to the first area and a fourth area corresponding to the second area and positioned to neighbor the active area. Furthermore, the display device may include first pixel formed in accordance with a first gate line positioned in the first area, second pixels formed in accordance with a second gate line positioned in the second area and having a number greater than the number of first pixels, and a power supply electrode positioned in the bezel area and supplying power to the first pixels and the second pixels. Furthermore, the display device may include at least one compensation portion for compensating for a load deviation occurring due to a difference in the number of pixels between the first pixels and the second pixels by forming a compensation capacitance.

In accordance with an embodiment of this disclosure, the formed compensation capacitance may include a first compensation capacitance formed through a first compensation pattern connected to the first gate line of the first area in the third area of the bezel area to overlap the power supply electrode with an insulating layer interposed therebetween.

In accordance with an embodiment of this disclosure, the at least one compensation portion may include a second compensation pattern connected to the power supply electrode and overlapping the first compensation pattern, and the formed compensation capacitance may further include a second compensation capacitance formed between the second compensation pattern and the first compensation pattern. In accordance with an embodiment of this disclosure, the first compensation pattern may be positioned between the power supply electrode and the second compensation pattern to form the first compensation capacitance along with the power supply electrode and to form the second compensation capacitance along with the second compensation pattern.

In accordance with an embodiment of this disclosure, the display device may further include a first opening part formed by removing a portion of the second compensation pattern overlapping the first compensation pattern.

In accordance with an embodiment of this disclosure, the display device may further include a second opening part formed by removing a portion of the power supply electrode overlapping the first compensation pattern, and the second opening part may not overlap the first opening part.

Those skilled in the art may understand that the disclosure can be modified and changed in various ways without departing from the technical spirit of this disclosure. In the example of the disclosure, an electroluminescent display has been described as an example, but the disclosure is not limited thereto and may be applied to various display devices, such as a liquid crystal display device (LCD), a field emission display device (FED), and an electrophoretic display device (ED). Accordingly, the technical scope of this disclosure is not limited to the contents described in the detailed description of the disclosure, but should be defined by the claims.

What is claimed is:

1. A display device comprising:
   an active area comprising a first area having a special-form portion and a second area not having a special-form portion;
   a bezel area comprising a third area close to the first area and having a special-form portion and a fourth area close to the second area and not having a special-form portion;
   a first power supply electrode positioned in the third area of the bezel area;
   a semiconductor pattern positioned in the third area of the bezel area and overlapping the first power supply electrode; and
   a plurality of dummy gate lines positioned between the semiconductor pattern and the first power supply electrode and overlapping the semiconductor pattern to form a first compensation capacitance and overlapping the first power supply electrode to form a second compensation capacitance,
   wherein the display device further comprises a first opening part and a second opening part,
   wherein the first opening part is formed by removing a portion of the semiconductor pattern overlapping the plurality of dummy gate lines,
   wherein the second opening part is formed by removing a portion of the first power supply electrode overlapping the plurality of dummy gate lines,
   wherein the second opening part does not overlap the first opening part, and
   wherein the bezel area is an area that surrounds the active area.

2. The display device of claim 1, wherein:
   the semiconductor pattern is connected to the first power supply electrode, and
   the plurality of dummy gate lines are connected to a plurality of gate lines of the active area, respectively.

3. The display device of claim 1, wherein the semiconductor pattern comprises a conductive semiconductor pattern.

4. The display device of claim 2, wherein:
   the first area of the active area comprises a first sub-area having a round portion and a notch portion formed by removing one side of the active area and a second sub-area having only a round portion, and
   the third area of the bezel area comprises a first sub-area close to the first sub-area of the first area, and a second sub-area close to the second sub-area of the first area.

5. The display device of claim 4, wherein the first sub-area of the first area having the notch portion comprises first and second sub-active areas split in left and right by the notch portion.

6. The display device of claim 5, wherein the plurality of gate lines comprises:
   a first and a second gate line disposed in an area close to the first sub-area of the third area of the bezel area in the first sub-active area and the second sub-active area; and
   a third and a fourth gate line disposed in an area close to the second area of the active area in the first sub-active area and the second sub-active area.

7. The display device of claim 6, wherein the first, second, third, and fourth gate lines comprise:
   a first, a second, a third, and a fourth gate line disposed in the first sub-active area; and
   a first, a second, a third, and a fourth gate line disposed in the second sub-active area.

8. The display device of claim 7, wherein the plurality of dummy gate lines comprises:
   a first and a second dummy gate line disposed in the first sub-area of the third area of the bezel area adjacent to the first sub-active area; and
   a first and a second dummy gate line disposed in the first sub-area of the third area of the bezel area adjacent to the second sub-active area,
   wherein the first and second dummy gate line are connected to the first and second gate line of the first sub-active area, respectively, and the first and second dummy gate line are connected to the first and second gate lines of the second sub-active area, respectively.

9. The display device of claim 8, wherein:
   the plurality of dummy gate lines further comprises a third and a fourth dummy gate lines disposed in the first sub-area of the third area of the bezel area and positioned between the first sub-active area and the second sub-active area,
   the third gate line positioned in the first sub-active area and the third gate line positioned in the second sub-active area are connected by the third dummy gate line, and
   the fourth gate line positioned in the first sub-active area and the fourth gate line positioned in the second sub-active area are connected by the fourth dummy gate line.

10. The display device of claim 2, wherein:
    the semiconductor pattern is positioned on a substrate,
    the plurality of gate lines is positioned on a gate insulating film positioned to cover the semiconductor pattern,
    the plurality of dummy gate lines is positioned on a first interlayer dielectric layer covering the plurality of gate lines, and
    the first power supply electrode is positioned on a second interlayer dielectric layer covering the plurality of dummy gate lines.

11. The display device of claim 10, wherein:
    the plurality of dummy gate lines are connected to the plurality of gate lines, respectively, through a contact hole formed in the first interlayer dielectric layer, and
    the first power supply electrode is connected to the semiconductor pattern through a contact hole penetrating the second interlayer dielectric layer, the first interlayer dielectric layer, and the gate insulating film.

12. A display device comprising:

an active area including a first area having a special-form portion and a second area not having a special-form portion;

a bezel area including a third area corresponding to the first area and a fourth area corresponding to the second area;

first pixels formed in accordance with a first gate line positioned in the first area;

second pixels formed in accordance with a second gate line positioned in the second area and having a number greater than the number of first pixels;

a power supply electrode positioned in the bezel area and supplying power to the first pixels and the second pixels; and at least one compensation portion for compensating for a load occurring due to a difference in the number of pixels between the first pixels and the second pixels by forming a compensation capacitance through a first compensation pattern connected to the first gate line of the first area in the third area of the bezel area to overlap the power supply electrode with an insulating layer interposed therebetween, wherein the compensation capacitance includes a first compensation capacitance formed through a first compensation pattern connected to the first gate line of the first area in the third area of the bezel area to overlap the power supply electrode with an insulating layer interposed therebetween, wherein the at least one compensation portion includes a second compensation pattern connected to the power supply electrode and overlapping the first compensation pattern, and wherein the compensation capacitance further includes a second compensation capacitance formed between the second compensation pattern and the first compensation pattern, wherein the display device further comprises a first opening part and a second opening part, wherein the first opening part is formed by removing a portion of the second compensation pattern overlapping the first compensation pattern, wherein the second opening part is formed by removing a portion of the power supply electrode overlapping the first compensation pattern, wherein the second opening part does not overlap the first opening part, and wherein the bezel area is an area that surrounds the active area.

13. The display device of claim 12, wherein the first compensation pattern is positioned between the power supply electrode and the second compensation pattern to form the first compensation capacitance along with the power supply electrode and to form the second compensation capacitance along with the second compensation pattern.

* * * * *